United States Patent
Hockaday

(10) Patent No.: US 8,013,238 B2
(45) Date of Patent: Sep. 6, 2011

(54) MICRO CONCENTRATORS ELASTICALLY COUPLED WITH SPHERICAL PHOTOVOLTAIC CELLS

(75) Inventor: Robert G. Hockaday, Los Alamos, NM (US)

(73) Assignees: Energy Related Devices, Inc., Los Alamos, NM (US); Kyosemi Corporation, Kyoto (JP)

( * ) Notice: Subject to any disclaimer, the term of this patent is extended or adjusted under 35 U.S.C. 154(b) by 774 days.

(21) Appl. No.: 11/825,681

(22) Filed: Jul. 9, 2007

(65) Prior Publication Data

US 2009/0014056 A1    Jan. 15, 2009

(51) Int. Cl.
*H01L 31/042* (2006.01)
(52) U.S. Cl. .......................... 136/250; 136/246
(58) Field of Classification Search ........... 136/243–265
See application file for complete search history.

(56) References Cited

U.S. PATENT DOCUMENTS

| | | |
|---|---|---|
| 4,514,580 A | 4/1985 | Bartlett |
| 4,697,041 A | 9/1987 | Okaniwa et al. |
| 5,482,568 A | 1/1996 | Hockaday |
| 6,355,873 B1 | 3/2002 | Ishikawa |
| 6,528,717 B2 | 3/2003 | Asai et al. |
| 2002/0096206 A1 | 7/2002 | Hamakawa |
| 2006/0043390 A1* | 3/2006 | Nakata ............................ 257/82 |

OTHER PUBLICATIONS

Polymide, http://en.wikipedia.org/wiki/Polymide.*

* cited by examiner

*Primary Examiner* — Kevin P Kerns
*Assistant Examiner* — Kevin E Yoon
(74) *Attorney, Agent, or Firm* — James Creighton Wray

(57) ABSTRACT

With small dimensional optics, small photovoltaic cells have heat distribution surfaces, very high concentrations and subsequently high utilization of the semiconductors can be achieved. Discrete photodiodes can be formed as spherical and other geometric shaped, cells with high performance characteristics, precision dimensions, and low cost. This invention positions discrete photovoltaic cells by using their geometric shape, elastic electrical mounts, couples them to small optical concentrator systems of refractory and or reflective optics and makes electrical network connections to those photodiodes, reliably, adjusting for thermal expansion, and at low cost to form low cost and reliable electrical power arrays. The electrical connectors and network can form part of the reflective optics and heat removal system. The electrical interconnection system can also form a reliable network that is self-correcting and tolerant of point failures.

80 Claims, 18 Drawing Sheets

MICRO CONCENTRATORS ELASTICALLY COUPLED WITH SPHERICAL PHOTOVOLTAIC CELLS

SUMMARY OF THE INVENTION

On a clear sunny day, the sun shines approximately 1,000 Watts of energy per square meter of the planet's surface. Solar energy to electricity conversion has the potential to be an ideal power source solution to escalating energy needs on earth. The primary limitation to solar energy is the high cost of the system. Currently the best photovoltaic cell systems have achieved approximately $2/Watt, however, to compete with conventional power supplies a factor of four-time reduction of cost, or $0.5/Watt, needs to be achieved.

Almost the entire cost of solar arrays is due to the large amount of expensive semiconductor used in current solar cell apparatus. Current solar cell technologies make arrays expensive, inefficient, and sometimes unreliable. Our innovation is a method of mass producing an array of cells with elastic contacts that also concentrate light to better utilize the expensive semiconductor, while not overheating, and reducing efficiency with the effect of efficient heat removal with small discrete photovoltaic cells. Thus, the system semiconductor cost component can be reduced. While if the concentrating optics costs per unit area are significantly lower then that of the semiconductors then the overall cost per unit area of the photovoltaic cell the cost of electric power produced is lowered. We have estimated that due to the far lower cost of micro-optical concentration systems compared to semiconductors, material costs reductions ranging from four to hundreds of times that of current photovoltaic cell costs can be achieved.

A practical aspect of creating a photovoltaic array of thousands of discrete photodiodes has lead to the challenge of reliably and efficiently making electrical and thermal connections to thousands of discrete semiconductors over a range temperature. We have found that attempts to create long strings of silicone photodiodes mounted on plastic substrates resulted in stresses and cracking failures from differential thermal expansion of building up in the assembly. In this patent elastic electrical and thermal contacts are used to hold the semiconductor bodies in place and allow the assembled system to flex and go through wide ranges of temperature change without losing contact or mechanical disassembly between dissimilar materials with a range of temperature coefficients. The geometry of periodically changing the direction of the electrical contacts and circuits on a substrate can also be used to avoid accumulating yield stress in electrical contacts due to differential thermal expansion or flexure of the system. Thereby keeping the electrical contacts in the elastic regime. Electrical contacts may be welded or soldered together while still maintaining the elastic compression on the solder or weld points prevents the electrical contacts from achieving yielding stresses in the soldered or weld points due to thermal expansion and mechanical vibrations. The elastic contacts make it possible to assemble the arrays with wide tolerances in the construction of the components.

The micro-concentration, efficient, and heat-sinking concept comes from the simple observation that smaller optics such as raindrops on leaves can concentrate sunlight hundreds of times into small spots without thermally burning the leaves. By concentrating sunlight, the solar cells can be run more efficiently and more cost effectively using the expensive semiconductor materials to transform them into a practical device photovoltaic array that can be produced as discrete cells, electrical connections, and mated with micro concentrating mirrors and lenses (U.S. Pat. No. 5,482,568). We have built several concentrator systems that test the concept. A solar concentrator system using a 2 cm diameter cylindrical glass rod, a sheet aluminum back reflector, and a 2 mm wide crystalline photovoltaic cell achieved seven times increase in the power output compared to the photovoltaic cell without the concentrating optics. There was an insignificant detrimental temperature rise in the photovoltaic cell with the light concentration. In another experiment we have observed that a focused spot from a microscope objective lens with a spot size of 18 microns on a silicone photovoltaic cell achieved an optical concentration of 34,000 suns while experiencing only a 2-degree temperature rise. The performance of the photovoltaic cell only experienced a 3% reduction in performance due to the higher concentration of light into a single spot on the photovoltaic cell. Thus with small dimensional optics, small photovoltaic cell and heat distribution surfaces very high concentrations and in turn high utilization's of the semiconductors can be achieved. The invention of this patent is focused on the practical aspect of forming reliably, and at low cost, the immense number of optical concentrators and individual cells to form practical power systems. The electrical connector can form part of the reflective optics as in our previous U.S. Pat. No. 5,482,568 patent. This electrical interconnection system can also form a reliable network that is tolerant of point failures.

Note: it should be pointed out and possibly illustrated that grating and holographic spectral spreads could also be using in this tilt optics arrangements.

165. Light ray
    166. Index of refraction material with high chromatic aberration (or interference grating)
    167. Electrical contacts and reflectors
    168. Green photodiode
    169. Blue photodiode
    170. Red photodiode
    171. Red light ray
    172. Green light ray
    173. Blue light ray FIG. 11 Chromatic aberration coupled to a semi-spherical layered photodiode stack.

174. Anti-reflective coating
    175. Light ray
    176. Lens
    177. Blue ray
    178. Red ray
    179. Focal point of red light.
    180. Blue light spot or zone on blue photodiode layer.
    181. Red light photodiode layer
    182. Center electrical contact.
    183. Outer layer contact
    184. Green light absorption layer
    199. Green light photons FIG. 12A. Two-side ground layered spherical photodiode stack.

270. Outer rim contact
    271. Outer photodiode layer
    272. Intermediate photodiode layer
    273. Center electrical contact
    274. Center photodiode layer
    275. Center electrical contact FIG. 12B Drawing showing the side to side and rim contact clamp for two sided ground cells or single side ground cells.

280. Electrical contact
    281. Rim electrical contact
    282. Outer photodiode layer
    283. Intermediate photodiode layer
    284. Central photodiode
    285. Center electrical contact
    286. Center electrical contact
    287. Electrical contact
    288. Dielectric substrate
    289. Back electrical contact
    290. Intermediate photodiode layer
    291. Outer photodiode layer
    292. Outer rim electrical contact
    293. Molded glass cover lens or mirror
    294. Elastic transparent interface material
    295. Slot or cavity in dielectric material FIG. 13A. Aligned asymmetric semi-spheres on a low friction coefficient surface.

185. Sound source
    186. Sound waves
    187. Teflon surface
    188. Shaped semiconductor bead
    189. Flat side of bead
    190. Back electrical surface
    191. High voltage source
    192. Electrical ground
    193. Upper grounded surface of pusher plate or grids FIG. 13B. Pusher and aligned semi-spheres on a low friction coefficient surface.

200. Pusher plate
    201. Aligned spheres on plate
    202. Shaped slot on pusher plate
    203. Hemispheric shaped recess on pusher plate
    204. Teflon surface dielectric
    205. Metal plate.

Figure 13A:
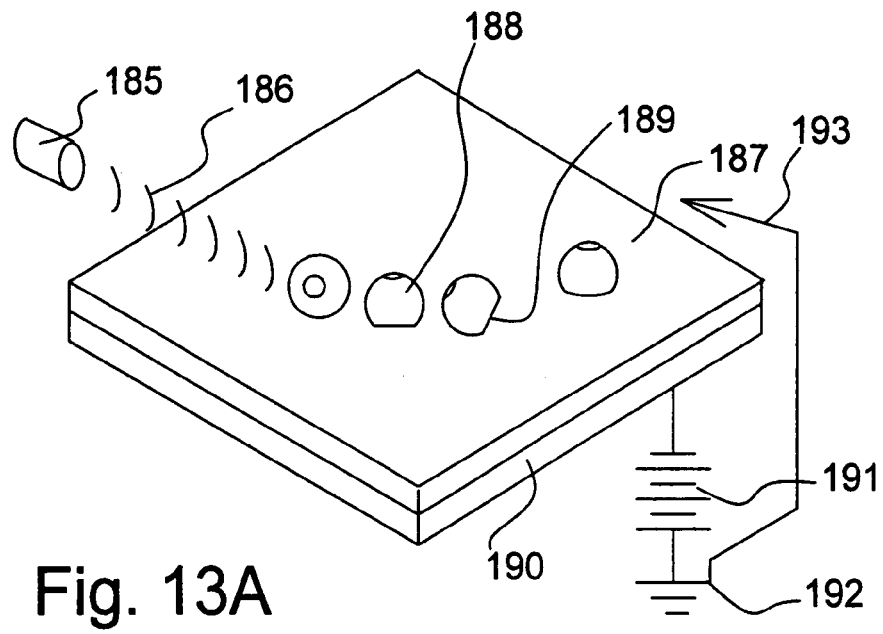
Figure 13B:
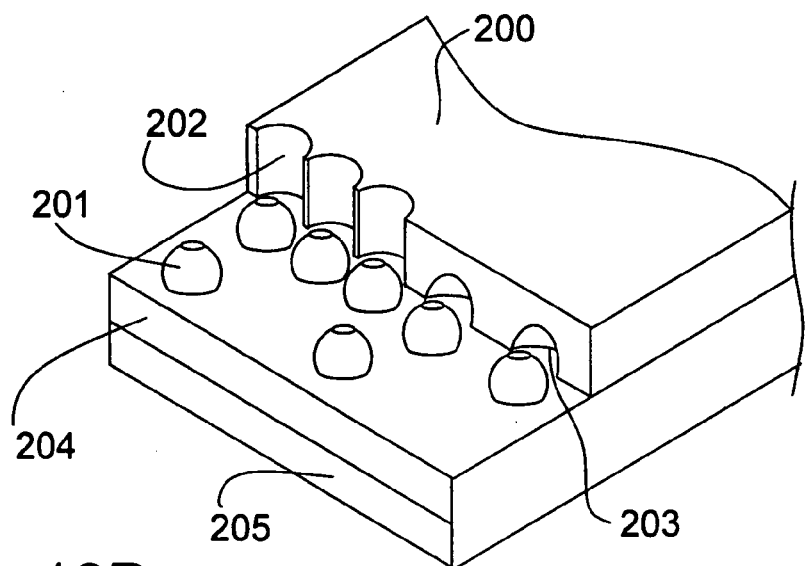
Figure 13C:
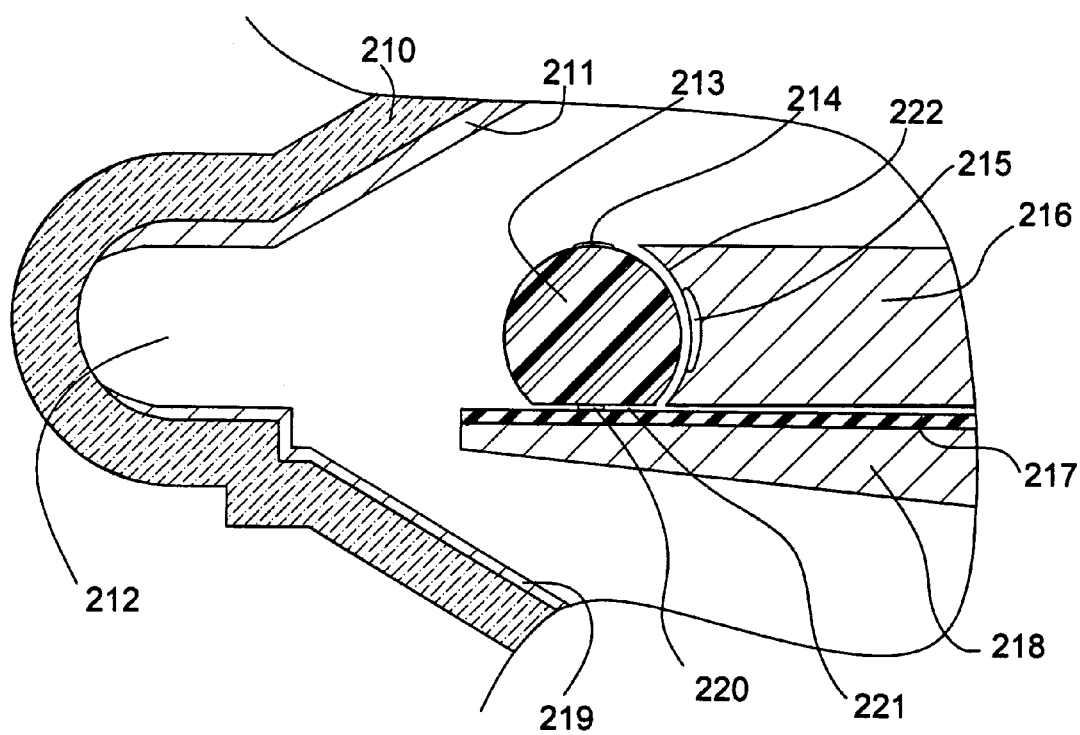

FIG. 13C. Pusher injecting an aligned semi-sphere into an electrical contact clamp.

210. Dielectric substrate clamp.
    211. Electrical contact and mirror.
    212. Shaped cavity.
    213. Asymmetric photodiode bead.
    214. Electrical contact.
    215. Silicone rubber contact surface pad at bottom of the shaped pusher
    216. Pusher plate
    217. Teflon film.
    218. Back plate
    219. Second electrode on dielectric shaped substrate and mirror.
    220. Second contact on the flat side of bead.
    221. Flat side of bead
    222. Shaped cavity on pusher plate.

Figure 14:
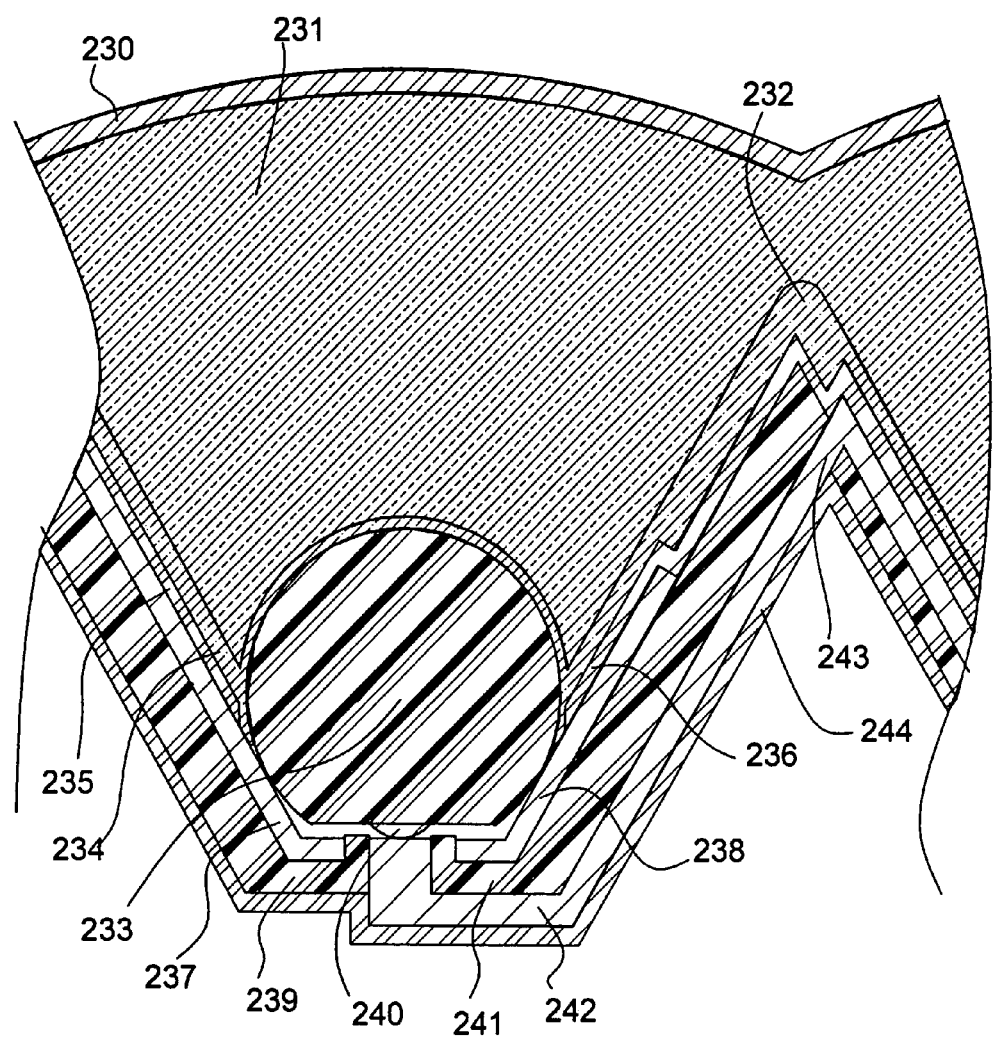

FIG. 14. Cross-sectional view of the center flat point contact and side contact to the photodiode in a shaped lens mirror circuit clamp.

230. Exterior transparent antireflective and protective coating.
    231. Refractory dielectric material lens-mirror.
    232. Dielectric optically transparent glue or optical coupling material.
    233. Semiconductor photodiode.
    234. Optically transparent glue or optical coupling material.
    235. Dielectric coating which could have a low coefficient of friction.
    236. Dielectric coating which could have a low coefficient of friction.
    237. Rim contact electrode.
    238. Rim contact electrode.
    239. Back dielectric substrate and electrical contact separator.
    240. Center electrically conductive center contacts.
    241. Back dielectric substrate.
    242. Electrical contact and circuit to the photodiode center contact.
    243. Via electrical connection between the photodiode center contact and the rim contact of the adjacent photodiode.

Figure 15:
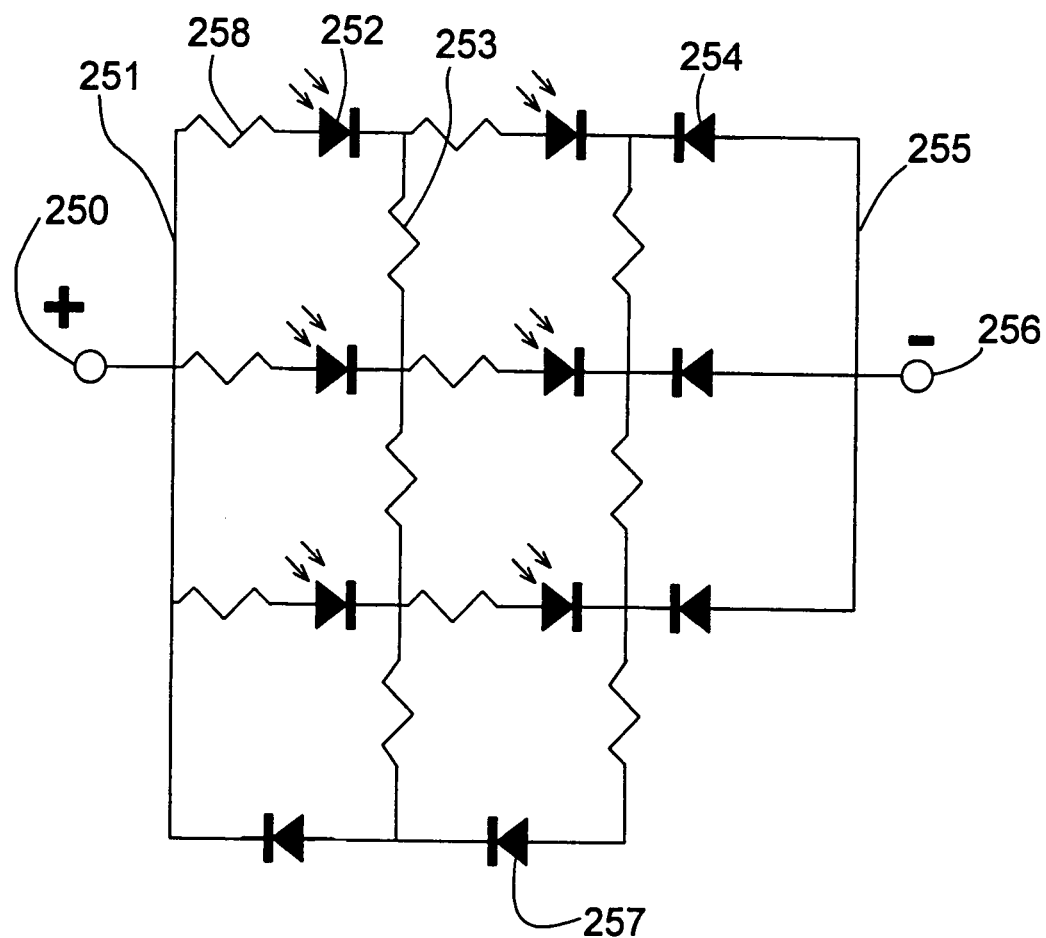

FIG. 15. Schematic diagram of the equivalent electrical circuit of photovoltaic array 250. Output connection, operationally positive polarity.
    251. Bus electrical connection.
    252. Photodiode.
    253. Thin wire or metal film on dielectric insulator thermistor or varistor.
    254. Reverse current check diode.
    255. Bus electrical connection.
    256. Electrical connection operationally negative.
    257. Bypass diodes.
    258. Thin film electrical conductors on dielectrics or varistors.

DETAILED DESCRIPTION OF EXAMPLES

Description Drawings

Figure 1:
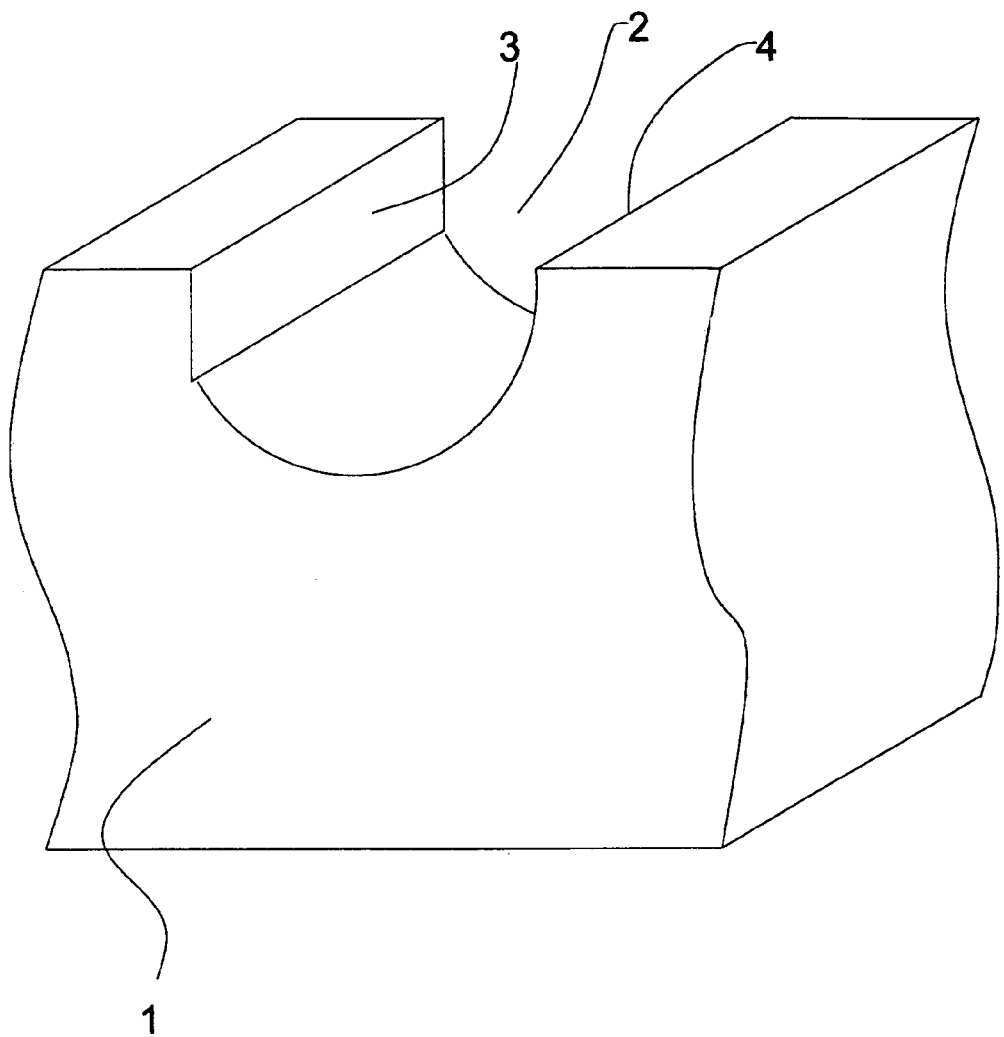
FIG. 1 Slot in dielectric material
1. Dielectric material
2. Slot
3. Flat side
4. Round side FIG. 2 Cross-sectional view of the shaped contact slot or hole
10. Electron conductor on outer surface
11. Dielectric substrate
12. $1^{st}$ electron conductor coating on flat
13. Slot
14. $2^{nd}$ electron conductor on round space side of slot
15. Electron conductor on outer flat of material
16. Bottom of shaped hole
17. Elastic substrate film FIG. 3 Cross-sectional view of the shaped contact slot or hole holding a spherical photodiode
20. The $1^{st}$ outer electrical conductor
21. The dielectric substrate
22. The $1^{st}$ electrical conductor in slot
23. The contact on inner doped region of sphere
24. The outer doped layer
25. The doped inner portion of sphere
26. The electrical contact on outer doped region on sphere
27. The electrical contact on the outer curved section of slot
28. The electrical contact on the outer surface of dielectric substrate
29. The antireflection coating of the spherical semiconductor
30. Bottom of slot glue or silicone coating
31. Slot or hole
32. Flat side of bead
33. Flat side of slot FIG. 4 hemispherical shaped hole with flat side to hold a spherical photodiode
35. Conductor coating
36. Conductor coating on the flat spot of hole
37. Hole in dielectric substrate 38. Electrical break
39. Electrical conductor on the outer surface
40. Electrical connector conductor on spherical side of hole FIG. 5 Example of system on a glass molded lens/mirror optic
49. Transparent dielectric sealant
50. Transparent lens/mirror optic 2D or 3D
51. Electrical conductor on mirror position
52. Semiconductor
53. Second contact on semiconductor
54. Electrical conductor and outer series array contact
55. Electrical conductor over opposite side electrical contact
56. Protective back plate
57. Dielectric sealant
58. Anti-reflective coating and glass protectant.
59. Dielectric sealant FIG. 6 The back reflector cell attachment version of an array
60 The refractor material
61 The upper lens
62 The lower mirror
63 The photodiode cup
64 The outer electrical conductor
65 The semiconductor
66 The dielectric substrate
67 The back plate or coating can be reflector or scatter
68 Back coating reflector or scatter
69 Shaped slot
85 Silicone rubber sealant FIG. 7 The spherical optics
70 The cross section at upper lens
71 Cross-section of electrical contactor and mirror
72 Cross-section of transparent material
73 Electrical contact to semiconductor sphere
74 Semiconductor sphere
75 Round side electrical contact to sphere
76 Cross-section of several electrical contacts to sphere
77 Electrical contact coating
78 Semiconductor sphere with PN junction and electrical contact
79 Electrical break
80 Second electrical contact
81 Hexagonal separation between cells. This cell may also be square packing.

Several typical embodiments of the invention are illustrated in the following frames. In these drawings several variations in assembly and arrangements will be shown. In FIG. 1 a slot is cut in a dielectric material or molded from a material such as soda lime glass. The glass slot is formed as a flat 3 on one side and curved on the other side 4 to match the curvature of the side grooved semicircular spheres shown later in FIG. 3. The slot 2 may have a slight taper on the flat 3 to accommodate small mounting variations of the semiconductor and assume a tight wedging fit of the semiconductor sphere to the slot 2. Examples of other dielectric materials are:

polyaramid plastic (Asahi-Kasei Chemicals Corporation Co. Ltd. Aramica Division, 1-3-1 Yakoh, Kawaski-Ku, Kawasaki City, Kanagwa 210-0863 Japan).
  polyimide plastic, DuPont Films, HPF Customer Services, Wilmington, Del. 19880
  silicone rubber, Sylgard® 184 Silicone Optical coupling adhesive Dow Corning, Dow Corning Corporation, Auburn Plant, 5300 11 Mile Road, Auburn Mich. 48611 USA
  EVA Elvax® (Ethylene-vinyl acetate) DuPont Corporation, Wilmington, Del. 19880.

Figure 2:
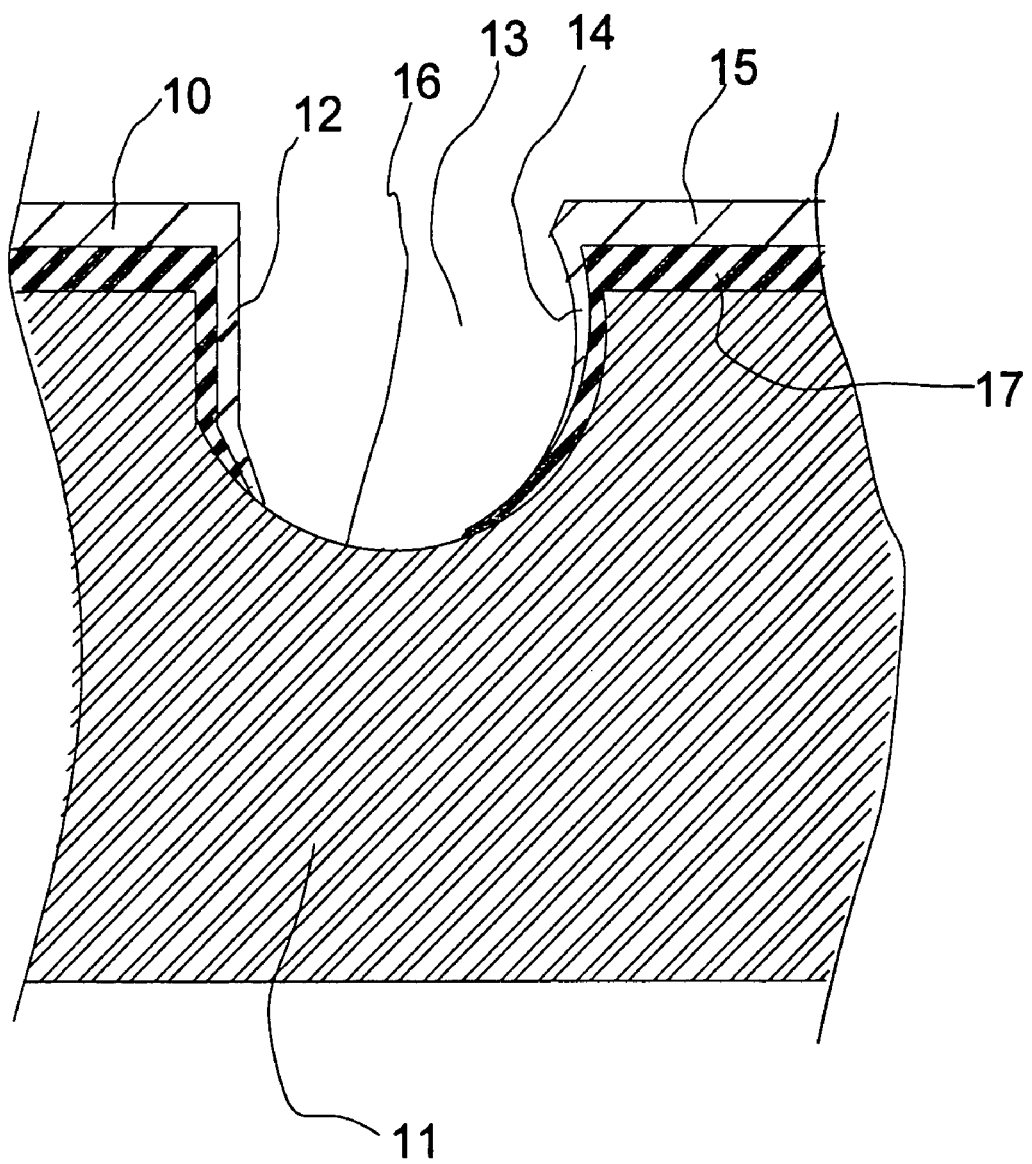

In FIG. 2 cross-sectional views of the dielectric 11 with a slot 13 cut or molded into the dielectric is shown. This FIG. 2 can also serve as an example of the cross section through a round hemispheric hole to hold single semiconductor bead. In this FIG. 2 an elastic substrate film 17 such as silicone rubber (Sylgard® 184 Silicone optical coupling adhesive) is deposited into slot 13 in the dielectric glass substrate material 11 and allowed to cure. An electrically conducting film, 10, 12, 14, 15 such as gold, platinum, palladium, silver, tin, aluminum, antimony, lead, copper, zinc, titanium, molybdenum, tantalum, tungsten, aluminum, nickel, carbon, silicon, iron, chromium, vanadium, niobium, zirconium, indium, alloys of these materials or conductive compounds such as tin oxide, zinc oxide or boron doped diamond is vacuum evaporated onto the elastic film 17. The conductive film 12, 14 is deposited part way into the slot 13. The contact point 12, 14 of the conductive film with the semiconductor beads contacts will be near the top of the edge of the slot when the bead is firmly in place. The electrical contacts film 12, 14 are not deposited on the bottom of the dielectric substrate, slot 16. This gap 16 in the conductive films 12, 14 forms the electrical break in the semiconductor mount. Contact by the flat electrode surface 12 and the curved electrode surface 14 of the hole 13 with the respective flat and curved electrodes of the photodiode will define a kinematic mount of the semiconductor bead shown in FIG. 3.

Figure 3:
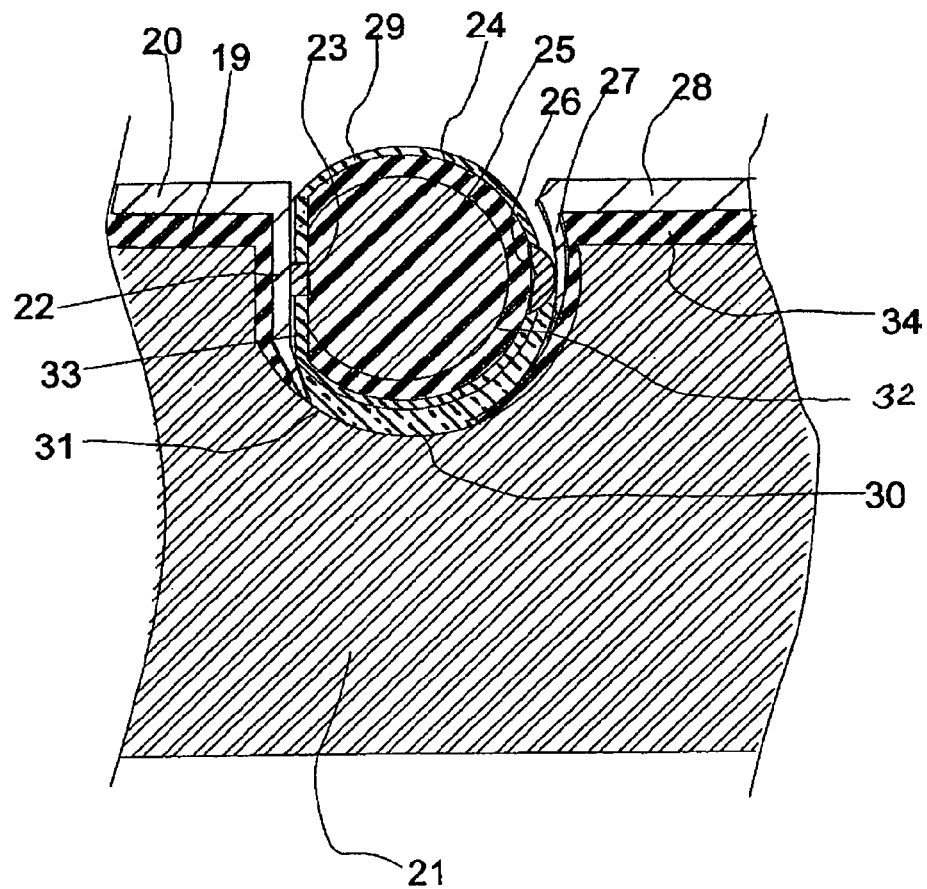

In the FIG. 3 a cross-sectional view of spherical bead of semiconductor is shown 25, 24, 29, 26 placed into the slot 31 the dielectric 21. The flat side of the photodiode bead 32, such as a Sphelar® silicon photodiode (Sphelar® Trademark of Kyosemi Corporation 949-2 Ebisu-cho, Fushimi-ku Kyoto-shi 612-8201 Japan), is aligned to the flat side of the slot 33 or hole. When the bead is aligned correctly it should slip into the slot 31 or hole 31 and be able to fit almost completely filling the hole 31. When the spherical bead with the flat side is miss-aligned with respect to the hole or slot 31 the bead should not be able to slip all the way into the hole or slot 31. This key-like feature avoids opposite polarity of the cells being connected and makes it possible to use sound to vibrate the beads or vibrate the substrate 21 to "shake" the beads 25, 24, 29, 23, 26 into the proper orientation and alignment with the semiconductor bead is placed in the slot the best electrical contacts 23, 26 make contact with the film contactors 32, 27 of the slots or hole 31. By having a film of sticky, electrostatic, or energy absorbing surface 32 such as silicone rubber at the bottom of hole or slot 31 the beads will stay in the hole or slot 31 when they correctly have fit the slot and make contact with the bottom of the slot. The slot can be part of a larger sheet frame that can be pried open during the filling with the beads and when the beads are all in place and can be tamped in the slots, the larger sheet frame can be released, thereby creating a clamping force on the beads and making electrical contact.

In operation light penetrates the semiconductor bead 24, 25 in the P/N junction doped layers 24, 25 region creating electron-hole pairs (P doped region on the inside 25 and N doped semiconductor 24 on the outside). The separation of electron pairs creates the positive polarity of the flat portion of the bead 33 negative polarity on the outer contact on the bead 26. The reverse process of supplying a voltage and current to the P/N junction can be done and the photodiode can produce light with the recombination of electron hole pairs. The P material 25 and the electrical contact 23 or the electrode 22 can form one junction of a thermocouple. The N material 24, electrical contact 26 and electrode 27 can form the other junction of a thermocouple. If the semiconductor junction 25, 24 is heated by light or infrared radiation, the contacts are designed to have sufficient thermal resistance to allow the semiconductor junction 25, 24 rise in temperature compared to the electrodes heat sink 20, 28 and have a temperature gradient from the semiconductors 25, 24 electrodes contact points 26, 23, and the electrodes 20, 28 then the Seebeck effect will create a voltage across the cell.

These cells can be connected in series just like the photovoltaic cells and produce electrical power. If current is passed through these cells in the reverse direction to the Seebeck effect the junctions 24, 25 will remove heat from the electrodes 20, 28 and heat the semiconductor junction 24, 25 by the Peltier effect. The electrical contacts 26, and 23 can be formed to have low thermal conductivity such as forming them point contacts and dielectric tunneling layers. Other possible electrical contacts with low thermal transport is to make the contact 26 partially with a dielectric and have close proximity electrodes that allow vacuum gap tunneling to occur moving electrons from the N layer 24 to the electrodes 27. The elastic compression from the substrate 21 and the sub layers 19, 34 of the two electrodes 20, 28 on the semiconductor bead contacts 23, 26 maintains contact dimensions between these components while the system may go through a range of temperatures and the coefficients of expansion may be very different between the electrodes 20, 28, substrate 21, and semiconductors 24, 25. The assembly of the semiconductor bead in the slot, or hole 31 is then part of a larger array of cells that are coupled to optics and electrically connected 28, 20 in series and parallel circuits for photovoltaic arrays, light emitting diodes, thermocouples, or Peltier refrigerators or thermionic converters. In the bottom of the slot 31 a glue 30, be used to secure the cell into the slot. The glue 30, such as Sylgard® 184, can be optically transparent and act as the optical coupling material between the substrate material 21 and the semiconductor bead 32, which is desirable in operation if the sunlight is coming through the substrate 21 into the semiconductor bead 32. The glue 30, can also act as an anti-reflective coating along with an antireflective coating 29 on the outside of the bead (anti-reflective fluorocarbon coatings, Mihama Corporation, 1-2-8 Toranomon, Minato-ku, Tokyo 105-8437 Japan) It should be mentioned that rods of the semiconductor 25 could be used in this slot geometry as well.

Figure 4:
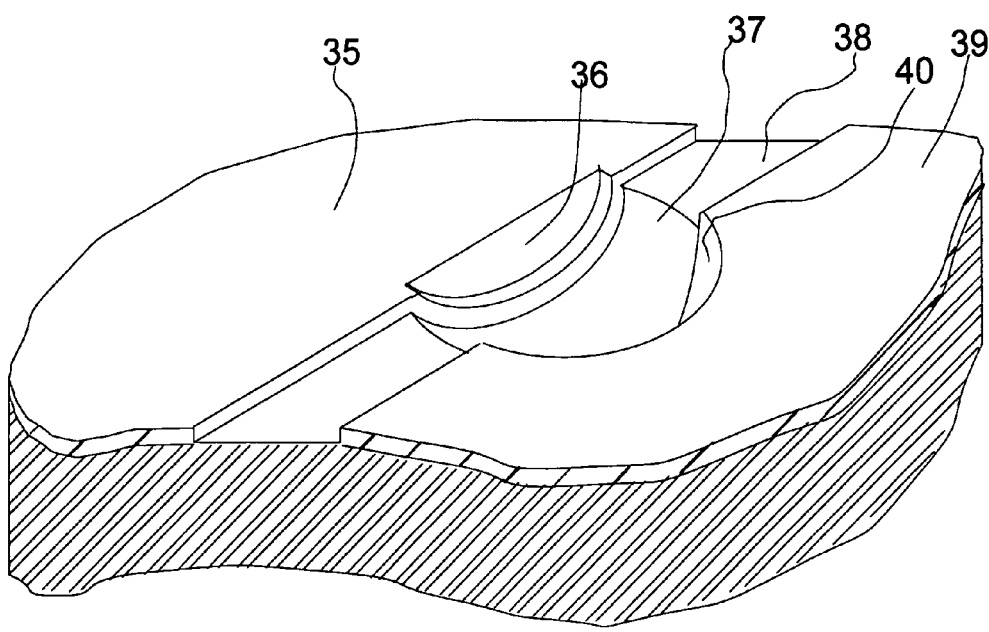

In FIG. 4 an example of a hole 37 fits the shape of the bead is shown and the electrical connection 36. The hole has a flat area with the electrical contact film deposited 35 on the flat area the dielectric 38 a electrical break area 38 is masked off and a second electrical contact is shown 39 coating the circular side 40 of the hole 37.

When the asymmetric semiconductor bead shown in cross-section in FIG. 3 is placed in the hole 37 it is allowed to only slip into the hole if the flat surface 36 of the bead and the sphere are parallel.

Figure 5:
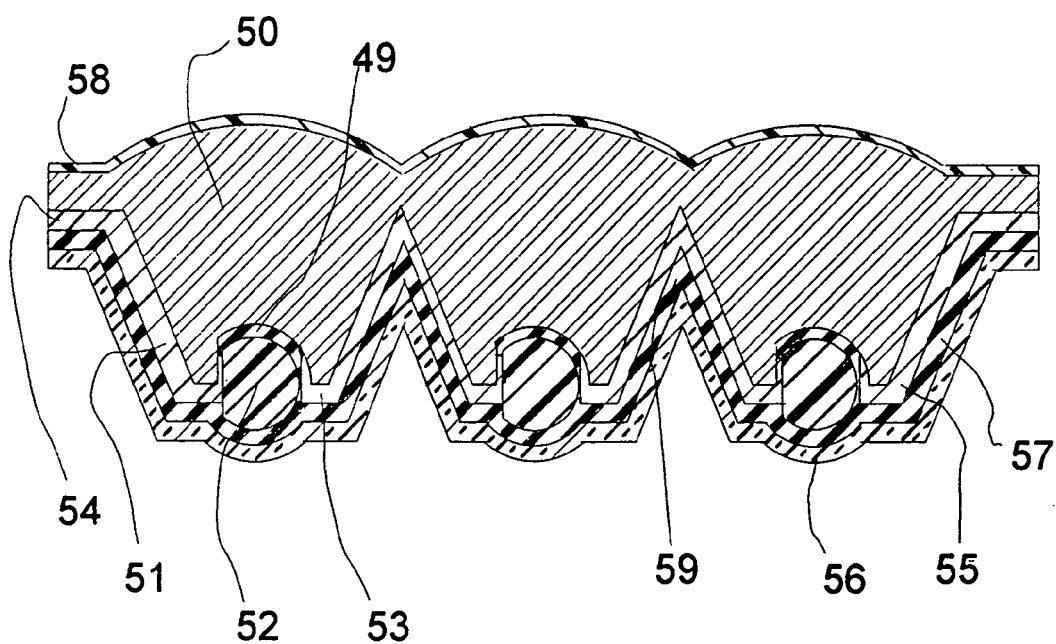

In FIG. 5 a cross-sectional view of an array of semiconductor spheres 52 attached with electrical contacts 54,51,53, 55 to the transparent optical lens/mirror 50 is shown. The photodiode array is formed by coating a shaped piece of glass 50 that has a curved lens outer area with an anti-reflective coating on the front surface 58. The back side of the glass 50 is shaped into concentrating mirrors. Mirror coatings and an electrical conductive film 51, 53, 55 are coated on the back surface of the glass 50. The back side of glass or transparent material EVA 50 has the slots 49 for the semiconductor beads formed in it that is shaped such that when the shaped semiconductor bead is wedged into the slot it is elastically holding the bead. A taper of roughly a five degree slope of the slot wall at the metal to metal contact point of the bead with the walls will insure that the bead will be unable to slip out of the slot due to frictional forces being much higher than the force of sliding out of the wedge. The mirror coatings and electrodes 54, 51, 53, 55 are deposited with angular controlled vacuum evaporation, ink jet printing, or angular controlled plasma spraying to coat the mirror reflector areas and not in the bottom of the slots 49 in the glass 50 to form an electrical break between electrodes. This uncoated region 49 is transparent to light. A suitable film for the mirror reflector electrodes 54, 51, 53, 55 is formed by coating the glass with tin which is then oxidized to tin oxide to be transparent. The semiconductor spheres 52 are inserted and wedged into the slot of the glass. A shaped back cover plate is placed over the array of photo-diodes and glued to the glass optic and diode array with silicone rubber sealant. The placement of the back plate, reflector, and heat sink 56 can apply elastic pressure on the semi conductor spheres through the dielectric film 59 of the back plate 56. The dielectric material 59 could be silicone rubber, or polyimide, and may also be the glue that attaches the back plate to the electrodes 54, 51, 53, 55, semiconducting bead 52 and glass 50. The glue can also penetrate up into the trough 49 between the semiconductor 52 and the glass 50 and act as an index of refraction transition material between the glass and the semiconductor 49. The sealant is also placed at the perimeter or the array to seal the semiconductor from dust and dirt. The aluminum back plate can have a bright polish surface facing the solar cells, or a white scattering surface. The exterior surface of the back plate can have a coating such as black, silicone paint to help the back surface radiate area keep the back plane cool. Silicone rubber sealant can also be used to seal the back side of the cells and insure good thermal contact between the cells and the back plane. Electrical contact between the electrodes 54, 51, 53, 55 and the semiconductor beads 52 may be assured by heating the assembly in a vacuum oven or a flash lamp illumination with an electric bias to create a large current to weld all the contacts. Other possible contact securing methods are ultrasonic pulse of energy to the contacts through glass or silicon beads to direct heat to the interface contacts. Soldering leads to the edges of the circuit 54, 55 may be attached with ultrasonic pulses.

Figure 6:
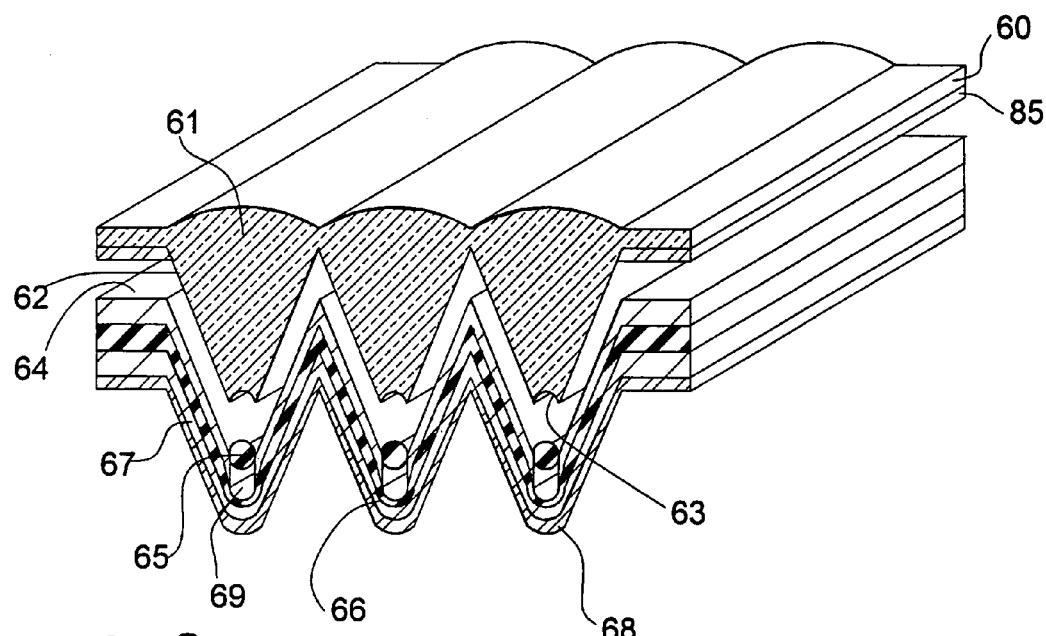

In FIG. 6 an alternative mounting arrangement of placing the silicon semiconductor beads 65 on the back surface 66. In this design the back surface 66 is an extruded glass sheet, polyimide, or a rolled or stamped steel or aluminum sheet 67, that is coated with a dielectric such as glass 66 and has the silicone bead locating slot 69 formed in it. The slot 69 has an electrical conducting coating 64 of the silver or tin vacuum evaporated surface coated on it and a gap 69 that is formed by masking or by the shadow of the shoulder of the slot 69. An outer surface coating 67 of a reflective material such as silver, tin or a white scattering material may be coated the back side of the substrate 66, if the dielectric is transparent or translucent it will act as a reflector of light the goes though the insulating gap 69. On the outer surface 67 a black radiator coating 68 could be put on. In some cases the black radiator 68 coating and reflective coating 67 could be omitted and the light that gets past the cells 65 could be used for lighting the space under the array.

In this design the light concentrating system is on an extruded sheet of glass 60. It has an upper lens 61 a lower array of mirror 62 and slots 63 formed to fit loosely around the silicon semiconductor photo-diodes 65. To form the completed array the glass sheet 60 is attached to the photodiode area with glue such as silicone rubber sealant 85 along the perimeter and possibly between the photodiodes 65 and the glass 60. If the silicone rubber sealant 85 such as Sylgard® 184 is optically transparent it can be placed throughout the array to act as an optical coupling interface. The electrical output of this array goes through the electrical conductive film 64 and out through the edges of the array.

Figure 7:
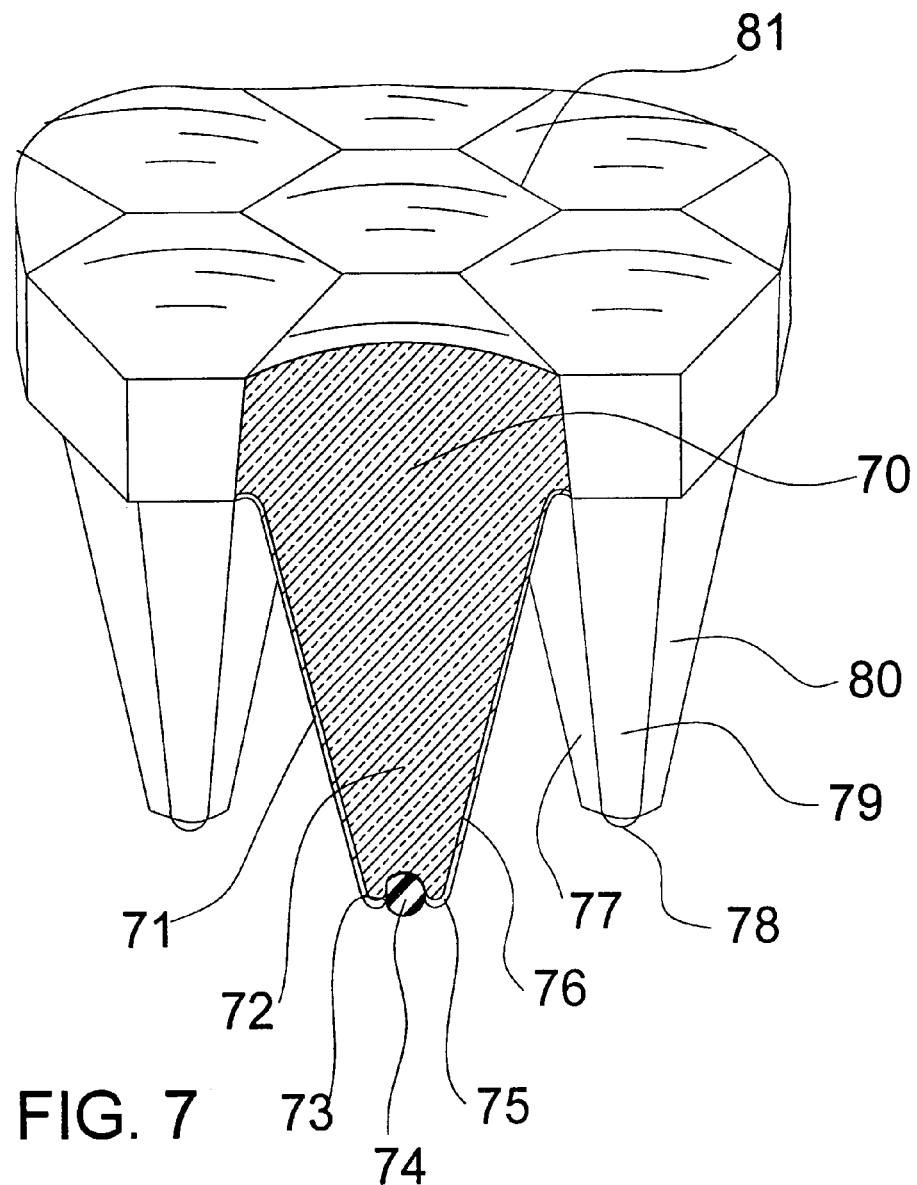

FIG. 7 the arrangement of optical concentration with three-dimensional optics. In this drawing the lens 70 and mirrors 71 are packed in a hexagonal pattern 81. Other possible patterns are squares, and triangles. The optical concentrator 70 are molded from glass 72. The upper surface 70 forms an array of lenses and the lower surface forms mirrors 71 and the heat fins.

Total internal reflection of the glass to air interface 70 is used. An electronically conducting film such as tin oxide is coated 71, 76, onto the surface of the glass on the mirror areas 77, 80 and into the shaped hole 73, 75.

The two electrodes 77, 80 are separated on either side of the glass reflector by a gap 79 on the glass reflector 72.

The semiconductor sphere 74, 78 is inserted into the shaped hole 73 at the end of the glass mirrors making contact with the two electrodes 71, 76. The insulator gap 79 could be formed by molding a channel on the side of the glass mirror 72 and then coating the glass reflector with a directional source of electron conductor material 77, 80 that will not fill the shadowed area of the gap 79. The insulator gap 79 could be formed by molding a channel on the side of the glass mirror and then coated into the glass 72 with a directional source that will not coat the shadowed area of the gap 79. In operation the light from the sun is focused through the lens 70 and reflected off the mirrors 71, 76, 75, 77, 79, 80 onto the photodiode cells 74, 78. The higher the concentrating power of the lenses 70 and mirrors 71, 76 the increased accuracy the array needs to be pointed at the sun. With low concentrations, approximately four times, the index refraction of glass 72 of approximately 1.5 refracts light from non-perpendicular rays sufficiently such that the concentrator array effectively concentrates light from the sun without the need to track the sun. Light that is not directly focused to the photodiode 74 such as scattered light through clouds can reflect on the reflective surfaces 71, 76 and partially reach the photodiode 74. The concentrating photovoltaic array can be fixed mounted tilted to maximize the output at noon and the latitude angle. Application of these types of low concentration concentrator photovoltaic arrays could be used for structural installations and non-solar tracking installations. The micro mirrors do not have to be perpendicular onto the surface plane and in some designs the mirror could be tilted in the array to maximize power output and performance when outer surface needs to be at a defined angle independent of the insolation angles.

Figure 8:
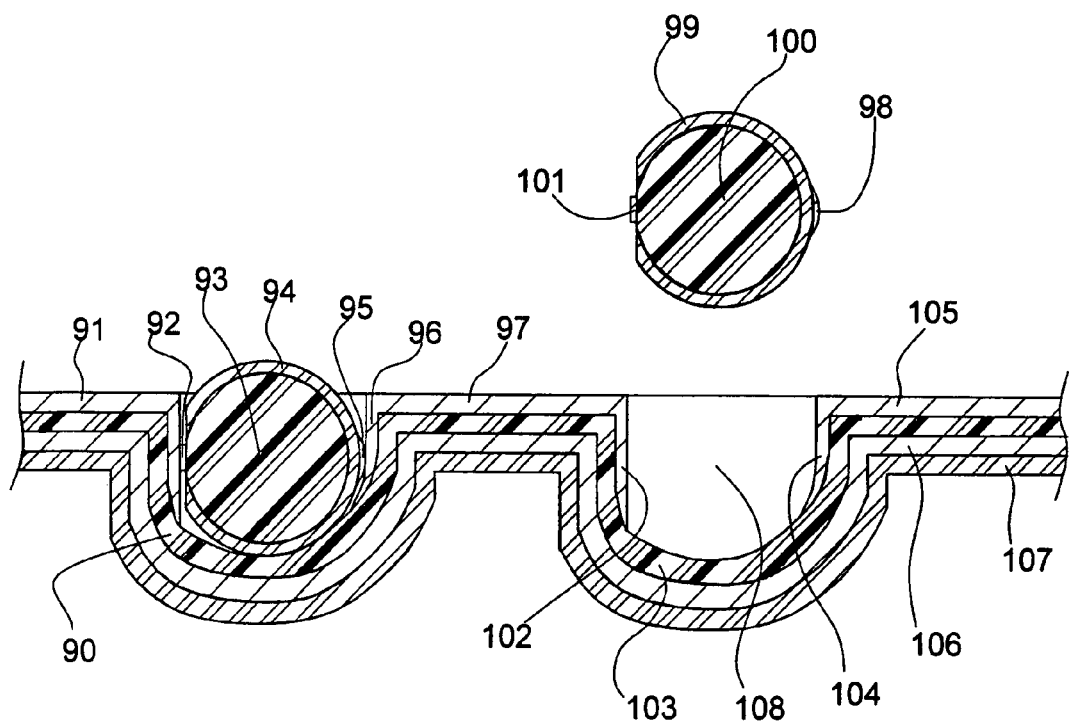
FIG. 8 Electrical wiring when the spheres are packed into a array
90 Molded dielectric substrate
91 Electrically conducting film
92 Electrical contact on flat side and inner material
93 Inner doped semiconductor
94 Outer doped layer
95 Contact on outer doped surface
96 Round side contact
97 Contact electrode
98 Reversed semiconductor that will not fit the sharp square side on hole
99 Outer surface doped layer
100 Inner doped layer
101 Flat side electrical contact
102 Flat side contact
103 Molded hemisphere with flat side hole dielectric could also be a scintillator
104 Rounded side electrical contact
105 Electrostaticly conducting film
106 Back reflector or scatterer with outside surface blackened.
107 Blackened outer surface
108 Molded slot or hole FIG. 9 Folded sheet clamped between lens/mirror
110 The formed transparent lens and mirror
111 Electrical connection tab
112 The electron conductive coating
113 The dielectric substrate
114 The back metal plate
115 The semiconductor sphere
116 The electrical output connection
117 Antireflective coating or TiO2 and/or anti-scratch or anti-abrasion or other optimal concentration schemes or ultra violet light filter
118 Electronics or batteries
119 Thermal phase change material
120 Insulated container or box
121 Fan motor or actuator
122 Air flow
123 Fan or valve
124 Heat pipe or heat circulation system
125 Blackened back surface
126 Optical coupling and sealing material FIG. 10 A Lens and back concentration plane system
109. Air gap
127. Dielectric substrate layer
128. Elastic layer
129. Light ray with a low angle with the surface of the lens
130. Lens
131. Light rays
132. Photodiode
133. Photodiode substrate surface and electrodes
134 Electrical breaks FIG. 10B Fresnel Lens and back concentration plane system
125 Second electrode and light reflector
136. Light rays
137. Fresnel lens
138. Photodiode
139. Dielectric substrate
140. First electrical contact and reflector FIG. 10C Single parabolic and front surface concentration plane system
141. Transparent dielectric window
142. Photodiode
143. Light ray
144. Electrical contact
145. Parabolic reflector
162. Air or transparent media
164. Transparent electrode FIG. 10D Cassigranian optics and back concentration surface plane system
146. Transparent window
147. Second reflector
148. Light rays
149. First reflector
150. Photodiode
151. Electrical conductor
152. Dielectric substrate
153. Air or transparent medium FIG. 10E Index refraction gradient concentration lenses (GRIN lenses) and back concentration system.
155. High index of refraction layer
156. Next highest index of refraction layer
157. Third highest index of refraction layer
158. Light rays
159. Electrical conductors
160. Photodiode
161. Lowest index of refraction FIG. 10F Spectral spread Red-Green and tilted optics systems.

In FIG. 8 the arrangement of the photovoltaic cell and micro concentrator when the cells are inserted into a thin flexible substrate is shown. In this arrangement a substrate dielectric membrane 90 with slots or holes 108 is formed by replicating a master surface, curing and then removing from the master surface. The dielectric replica 90 is then coated with a directional or surface coating 91, 97,105 to only coat the outer surfaces and the edges 96,102,104 of the slots or holes 108. In the case of holes 108 an electric gap can be provided by a groove slot or impression area 103 of the substrate 90 other possible techniques are, screen printing, ink jet printing, plasma spray coating, electroplating, the metal coatings 91, 96, 97, 102, 104,105 such as silver powder or tin powder, vacuum deposition of the electrical conductor film. These electrical conductive coatings 91, 96, 97, 102, 104,105 can have particles in them or cure in such a way that they form a reliable conductor contact with the semiconductor photodiode 92, 93, 94, 95 101, 100, 99, 98. A wide variety of texturing, dimpling, pedestals, fibers, fluting, slitting, and an elastic polymorphic surface can be molded into the replica surface contact 96, 102, 104 to help achieve and elastic electrical contact surface with the contacts on the particulate photodiode contacts 92, 95, 101, 98. The replica surface 91, 96, 97, 102, 104, 105 can also contain fibers and/or have electrical conducting fibers placed in it. Another method of forming electrical contacts 91, 96, 97, 102, 104, 105 is to laminate electrical conductive foils, wires, fibers, conductive mesh, conductive fiber matrix, or powders into the dielectric substrate. The next construction step is to coat the back side of the molded dielectric 90 with a back reflector 106 silver, tin, or a titanium white scattering film. This could be a silicone paint loaded with titanium dioxide particles. On the exterior surface of the back reflector 106 a protective and thermal radiating film 107 such as silicone paint loaded with carbon black or titanium oxide particles that radiate in the infrared and radiantly remove heat from the back side of the array is deposited. The photodiode spheres 100, 93 with the doping 99, 94 and electrical conductor contact points 92, 95, 101, 98 are placed in the slots or holes of the structure. With proper forming of the dielectric substrate 90 and the electrical contacts 102, 104 photodiode spheres 100 will only fit elastically in the slots holes 108 one way and achieve only the proper electrical contacts with the other photodiodes 93 in the array. With the photodiode array connected the array could be placed in a vacuum oven to anneal the contacts 91, 96, 102, 104, 92, 95, 101, 98 and possibly solder the contacts in place. To protect and assemble the photodiode array in to a larger module system they can be embalmed in a material such as chlorofluorocarbon or coated with silicone rubber sealant and laminated to a sheet of glass such as shown in FIG. 10A, 10B, 10C, 10D, 10E, 10F. The cells can be positioned and clamped between a glass lens and mirror with groves or slots located to hold the photodiode spheres at the focus or concentration spot of the lens mirror assembly such as shown in FIG. 9.

Figure 9:
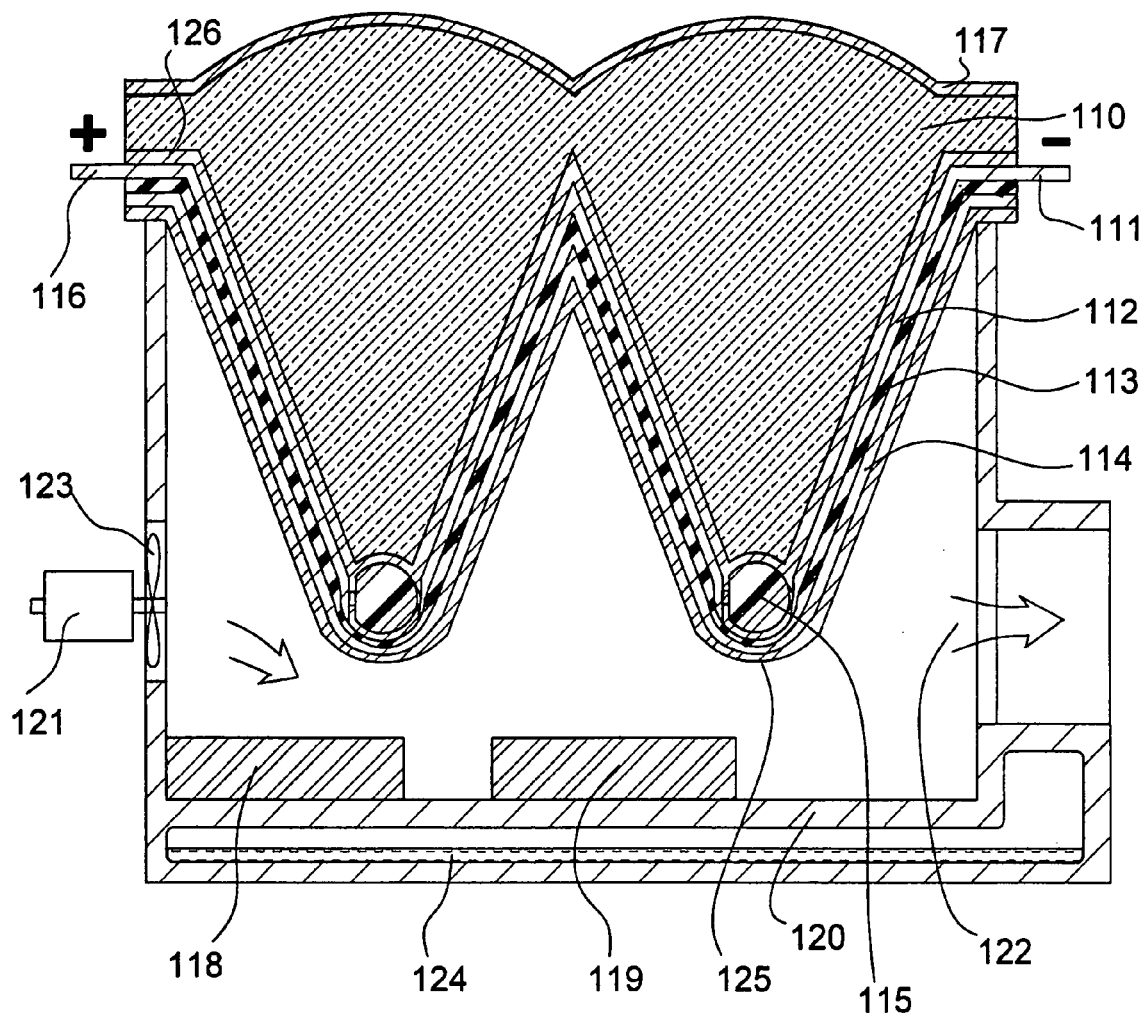

In FIG. 9 a variety of components could be assembled with the micro concentrator photovoltaic array to form a power system. Heat removal and thermal storage can be incorporated with the photovoltaic array management of the waste heat off the photovoltaic arrays and provide a thermal management of the photovoltaic array. The micro concentrator photovoltaic array is shown in cross section in FIG. 9 with the components of anti-reflective coating 117, molded glass lens 110, in interface layer 126, reflector 112, elastic under layer and dielectric substrate 113, thermal conductive substrate 114, and radiant coating 125 and back surface of the photovoltaic array. The radiant coating 125 could be textured to have, fibers, fins, bumps, ridges, or dimples to increase convective heat transfer. The coatings would have a high infrared emissivity such as titanium dioxide and carbon black or graphite particles loaded in silicone rubber paint. It should be mentioned that the molded glass 110 could have a flat outer surface, which may make it easier to keep clean from dirt. When the array is assembled between the glass and the mirror array of cells they are pressed tougher with the glue in interface layer, such as Sylgard®, at or above the maximum operating temperature of the array and cured at this temperature. Due to the higher coefficient of expansion of the glue 126 compared to the mirror array 112, 113, 114, 125, and glass 110 the glue 126 will shrink and be under tension at the operating temperatures. This tension in this interface layer will pull on the mirror 112, dielectric backing 113, and thermal conductive substrate 114 and maintain compression on the contacts to the semiconductor beads 115. The electrical current is collected from the series connection contacts 112 on the 115 beads and delivered to the side of the array. The electrical output from the photovoltaic array is shown schematically as positive 116 and negative terminals 111. An enclosure 120 can be placed on the back of the photodiode array 125. This enclosure 120 could be a simple as a chimney to direct convective air flow past the photovoltaic arrays 125 or could be a circulated fluid 122 such as fluorocarbon, alcohol, or water. A typical arrangement that minimizes the corrosion impact on the photovoltaic array 125 is to have air 122 pumped with a fan 121, 123 past the photovoltaic array 125, and the heated air 122 is used for structural heating. The fan or pump 121, 123 can be run when it is necessary to cool the photovoltaic arrays 125 or deliver heat to the structure. The ridge or bumpy exterior 125 of the photovoltaic array achieves a better heater transfer coupling from the photovoltaic array into the flowed fluid 122 than a planar photovoltaic array. A phase change material 119 can be placed on the back of the array 125 or in the flow plenum 120 to temperature stabilize absorb heat and thermally store heat in the system. The DC electrical output 116, 111 can be connected to an electrical conversion system 118 that optimizes the performance of the photovoltaic array and converts the electrical output to a desirable electrical output such as 110 Volt alternating current. Capacitors, reversible fuel cells, and/or batteries could be incorporated in to the electronics conversion system 118 to store electrical energy adjacent the array 125. A heat pipe system 120,124 could be incorporated in the back of the photovoltaic array 125 to delivery waste heat efficiently to structures. The heat pipe 120, 124 could have a boiling point set by an impurity with the working fluid 124 or elastic walls 120 to create a constant pressurization of the heat pipe to set the boiling point of the heat pipe to only remove heat when the array temperatures are useful to be delivered to the structure.

Various coatings 117 such as infrared and UV absorbing film of titanium diode films, such as TPX sol™ titanium dioxide coating, Kon Corporation, 91-115 Miyano Yamauchi-cho, Kishima-gun Saga prefecture, Japan, may be applied to the outer surface of the glass to reduce the heat flux on the photocell from the un-utilized infrared solar radiation, bellow the band gap of the semi-conductor. The antireflective coating 117 could be a material such as titanium dioxide that absorbs UV light and photo catalytically oxidizes organic material on the outer surface of the glass to keep the surface transparent and reducing possible UV damage to the glass 110 and photovoltaic array 1115, 112, 113, 114, 125.

FIGS. 10A, 10B, 10C, 10D, 10E, 10F and 10G show various alternatives light concentrating systems that can be coupled to the elastic contacted cells.

Figure 10A:
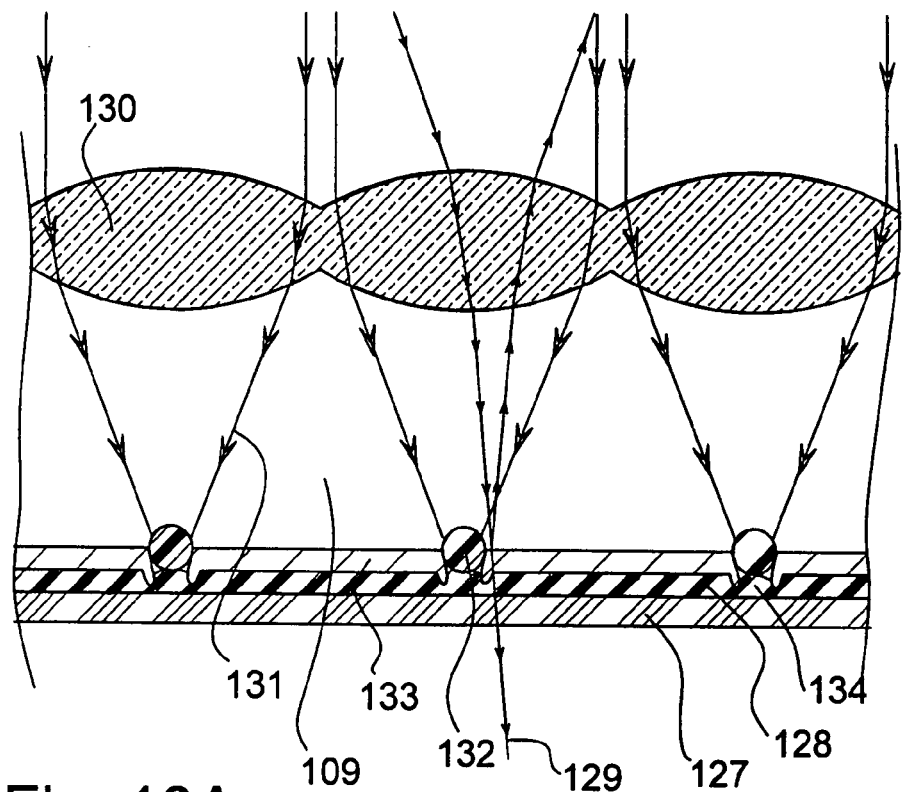

In FIG. 10A a lens array 130 with precision placement of photodiodes 132 in elastic contacts 133 is shown. An air gap 109 between the lens arrays provides for thermal insulation where this array may be used as a glass window or skylight. The electrical contact film can be a transparent tin oxide. Contact breaks 134 are shown between the cells, and elastic dielectric such as silicone rubber layer 128 and a transparent dielectric substrate 127, such as a flat molded glass sheet, are shown. In this arrangement, light 131 would pass through the lens array 130 to focus onto the semiconductors 132 without reflecting off mirror electrodes 133. This system does not capture light that does not reach the focus at the photodiode 132. Thus, diffuse light with low angles 129 to the surface other lens surface 130 would reflect or pass through the arrays if the electrical contacts 133 are reflective or transparent. The light transmission optical arrangement could be useful for room lighting such as a skylight or windows where the direct sunlight is captured while light that has a low angle to the surface 129, such as morning and evening light, scattered light off the clouds and scattered light of the atmosphere misses the photodiode 132 and passes into the room. In this example the semiconductor contacts 133 are shown on a flat substrate 127, but it could be a shaped substrate 127 that helps hold the semiconductors and uses light reflections off the shaped electrodes 133 on the elastic layer 128 and the substrate 127 to collect light to the semiconductor 132. A possible additional feature is to have the elastic layer component 128 be a phosphor or scintillator and convert light that is absorbed in this layer converted to a characteristic emission light of the phosphor or scintillator. Examples of scintillator materials are anthacene that can be dissolved and dispersed into polymers or rubber (Pfaltz and Bauer, 172 E. Aurora St. Waterbury Conn. 06708). An example of a phosphor is zinc sulfide (ZnS) activated with dopants of copper or silver. Another example of a phosphor is yttrium aluminum garnet crystals that convert blue light to yellow light. The characteristic emission light is emitted at all angles but due to total internal reflection of the elastic sheet of material 128 and the reflections off the electrodes 127 and the a substrate material 127 internal reflections the light is conveyed to the photodiode where the elastic layer 128 changes angle and thickness. An advantage of using a scintillator compared to the phosphors is that is does not absorb it's own characteristic light and lower energy photons, thus it can be used in the transmission components 130, 109 and the elastic layer 128 letting the lower energy photons focus through the optics. The scintillating layer due to internal reflections and low characteristic light absorption can effectively collect converted light from a large area or volume of optical components 130, 109, 128 and deliver it to the photodiodes 132. Phosphors and scatterers would be expected to be used on non-transmissive components such as the electrodes 133, elastic layer 228, or substrate 127 and could also be used to redirect non-focused light 129 to the photodiodes 132.

Figure 10B:
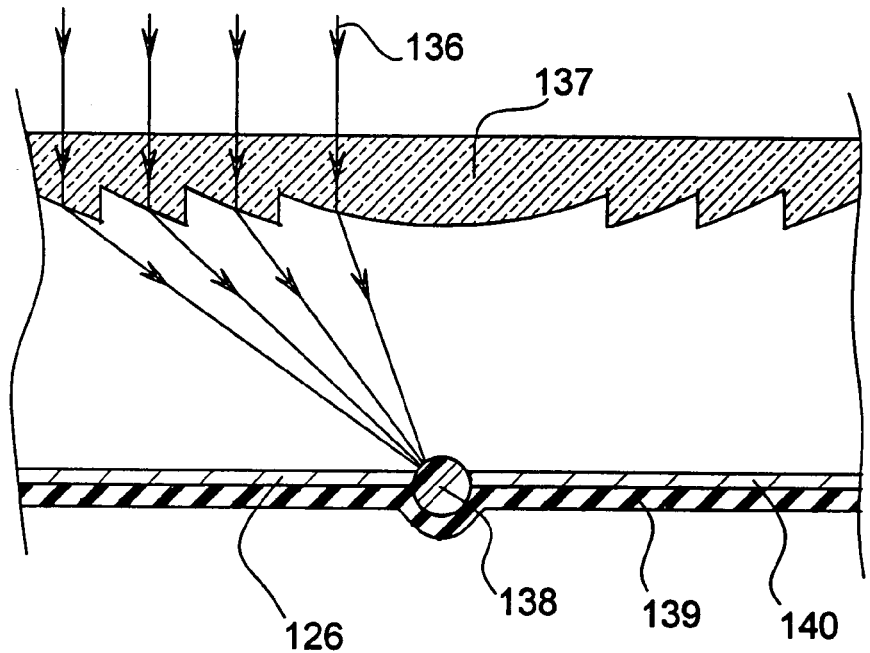

In FIG. 10B a Fresnel or holographic light concentrator 137 is shown as the light concentrating element. This is an example of different types of optics could be used to concentrate light to the discrete photodiodes. In this example a cross sectional view of a Fresnel lens 137 is shown. Light 136 passes through the transparent lens material 137 and then is refracted from the facets of the Fresnel lens and is focused to the semi conductor 138. The optical element 137 could also be a holographic lens that can concentrate light to the photodiodes 138 by a diffraction pattern such as grooves in the interior surface of the transparent material 137 instead of refraction with a wide range of incident angles to the photodiode 138. In this example the substrate material 139 is a shaped elastic polyimide substrate for the contact electrodes 126, 140 holding the silicon photodiode 138. As in the previous example in FIG. 10A the elastic substrate 139 could be a scattering surface, scintillator, or phosphor and act like a converter and conduit of light that is not initially focused to the photodiode 138.

Figure 10C:
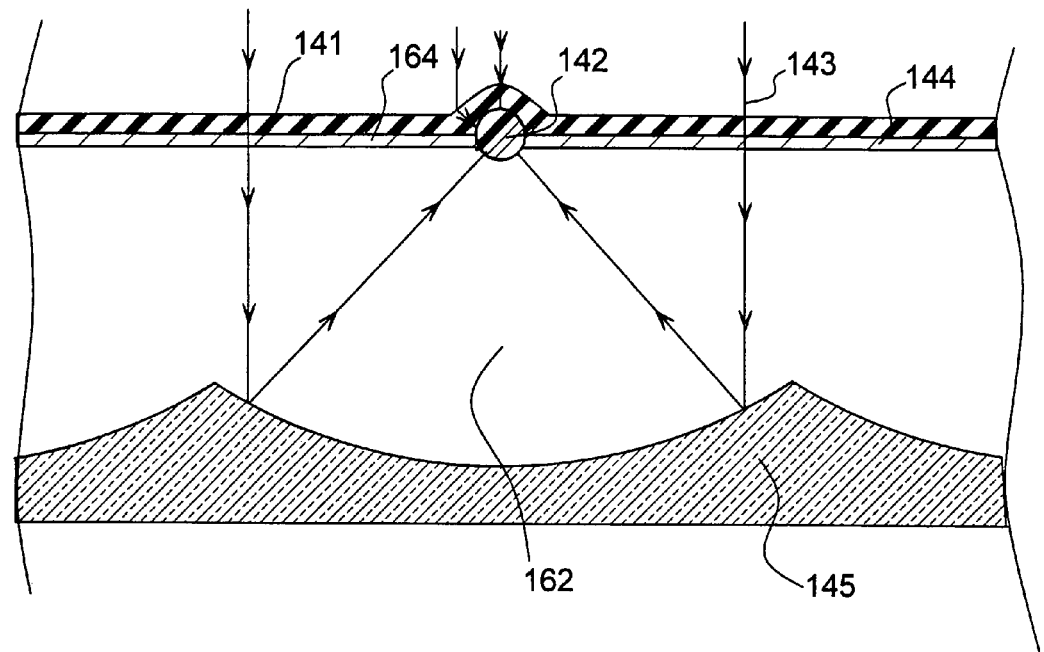

In FIG. 10C an example of a back reflector and photodiode array on front surface is shown. In this example the incident light passes 143 through the elastic substrate and the electrical conductors. The light 143 reflects off the aluminum reflector 145 and is concentrated onto the photodiode 142. The photodiode 142 is held with two transparent electrical contacts 144, 164 such as tin oxide or thin network of opaque silver electrical conductors that are held onto the photodiode with elastic substrate material such as fluorocarbon. A transparent material 162, such as silicone rubber, could be placed between the conductive electrodes 144 and the mirrors 145. The transparent elastic substrate material 141 such as fluorocarbon plastic is shaped to form an elastic clamp around the semiconductor body 142 and also act as a lens for the direct incident light.

Figure 10D:
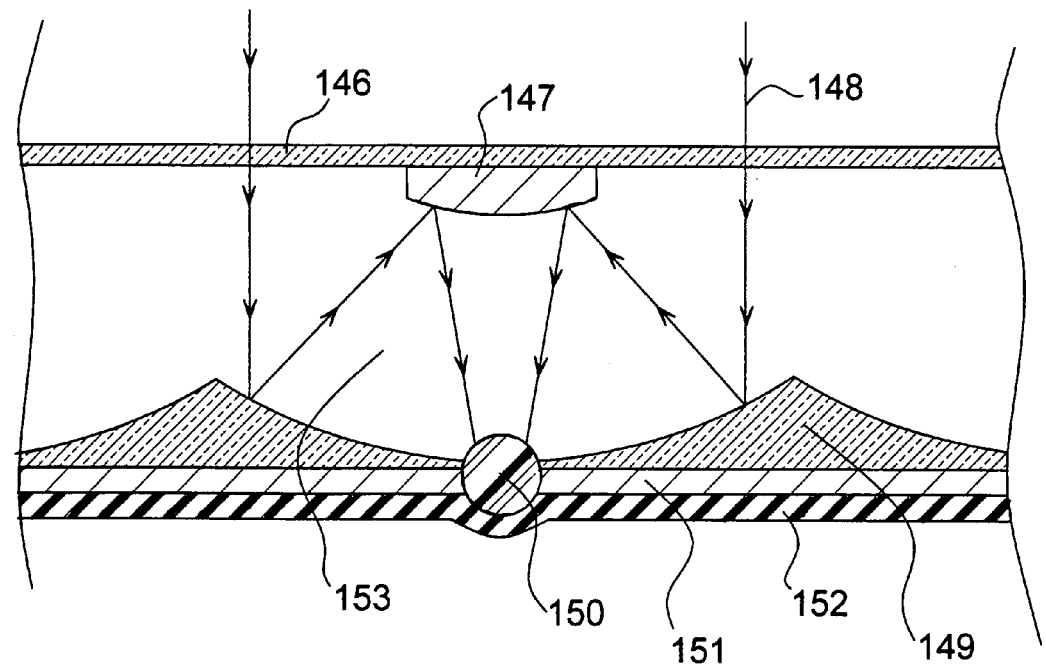

In FIG. 10D a Cassigranian light concentrating system with photodiode 150 on the back surface is shown. In this arrangement the light passes through a transparent glass cover sheet 146, through air or transparent material cavity 153, reflects off a shaped mirror 147, makes a second reflection off a shaped mirror mounted 147 on the glass cover sheet, and is focused to the photodiode 150. The cassigranian optics have a light collecting disadvantage that the second reflector blocks direct rays from reaching the semiconductor, but this could be useful if there is a need to shield the photodiode 150 from high energy radiation. The second mirror 147 could incorporate shielding material. Electrical connections are made to the photodiode 150 through the shaped aluminum mirrors contacts 149 on the silicone rubber elastic sub layer 151 and assembled on the polyimide dielectric substrate 152. The elastic sub layer 151 maintains contact pressure on the photodiode 150 even though the entire system experiences differential expansion between the components 152, 151, 149. An optically transparent material such as silicone rubber could be placed between the front surface 146 and the reflectors 149.

Figure 10E:
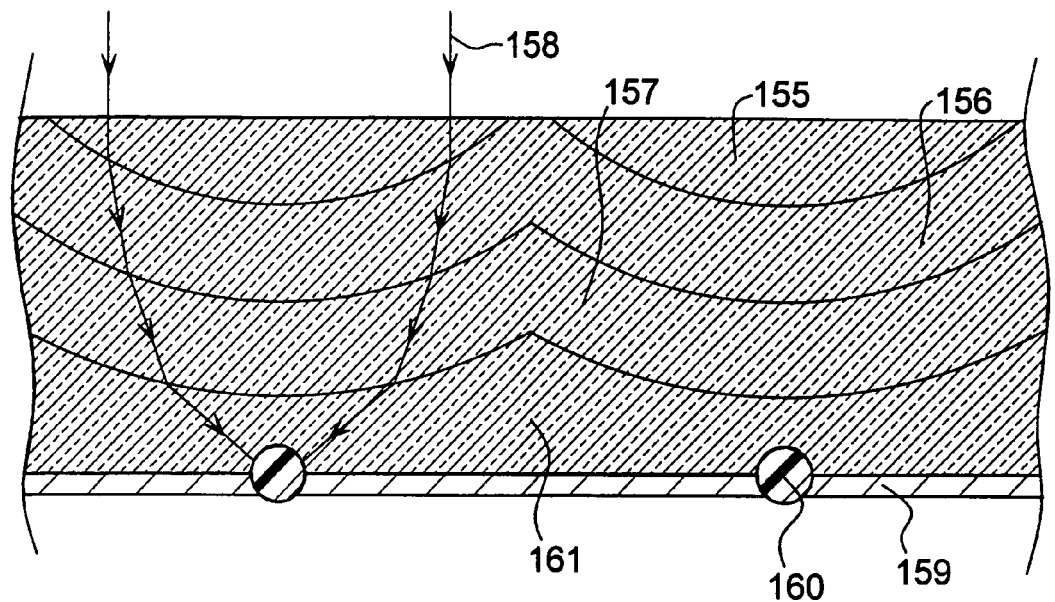

In FIG. 10E light concentrating optics using a gradient index of refraction lens is shown. In this arrangement the optical material is the elastic substrate, such as doped silicone rubbers and fluorocarbon polymers, are layered and shaped in increasing index of refraction layers 155, 156, 157, 161 to focus the light to the photodiode 160. Light rays refract 158 off the shaped layers of the silicone rubbers 155, 156, 157, 161 to focus on the photodiode 160. The contact electrodes 159 are elastically pressed onto the photodiodes. The last layer of the refractive material is molded to form compression cavity 161 when the photodiode is pressed into the cavity. The cavity 161 is designed with the electrodes to make junction contacts onto the photodiode 160.

Figure 10F:
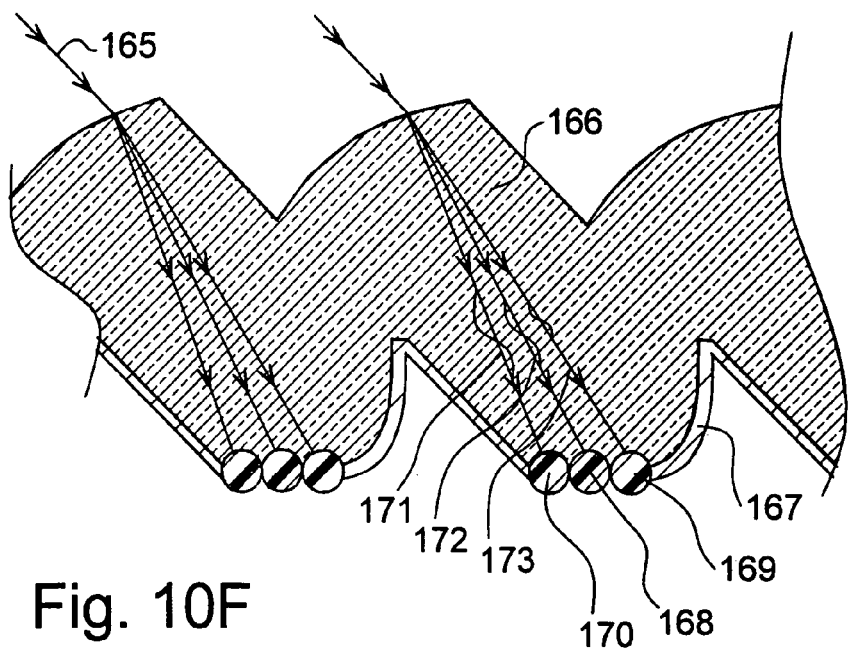

In FIG. 10F a tilted or off-axis concentration scheme is shown. This allows the array to not be perpendicular to the rays 165 from the sun for possible architectural reasons or this tilted to incident light 165 surface geometry to take advantage of chromatic aberration. The index of refraction spread to the light spectrum can be used with the tilted refractory surface to place different wavelength portions of the light spectrum into different photodiodes that are optimized for that portion of the solar spectrum. Typically light passing at an angle through a refractory material resulting in red light 171 refracting with the largest angle and then green light 172 and finally blue light 169 with the lowest light refraction. Thus a row of photodiodes 170, 168, 169 can be arranged to optimally intercept the spectral spread of light: red light photodiodes 170 in the first row, green light photodiodes 168 in the second row and blue light outer 3rd row of photodiodes 169 in reflective slots 167 coupled with micro concentrator glass 166 with a tilted geometry. The photodiodes are placed and glued into the shaped elastic cavities in the elastic transparent refractory material with a silicone rubber such as shown in FIG. 3; with electrical contact film making compression contact 167 to the two sides of the cells stacks 170, 168, and 169.

Figure 11:
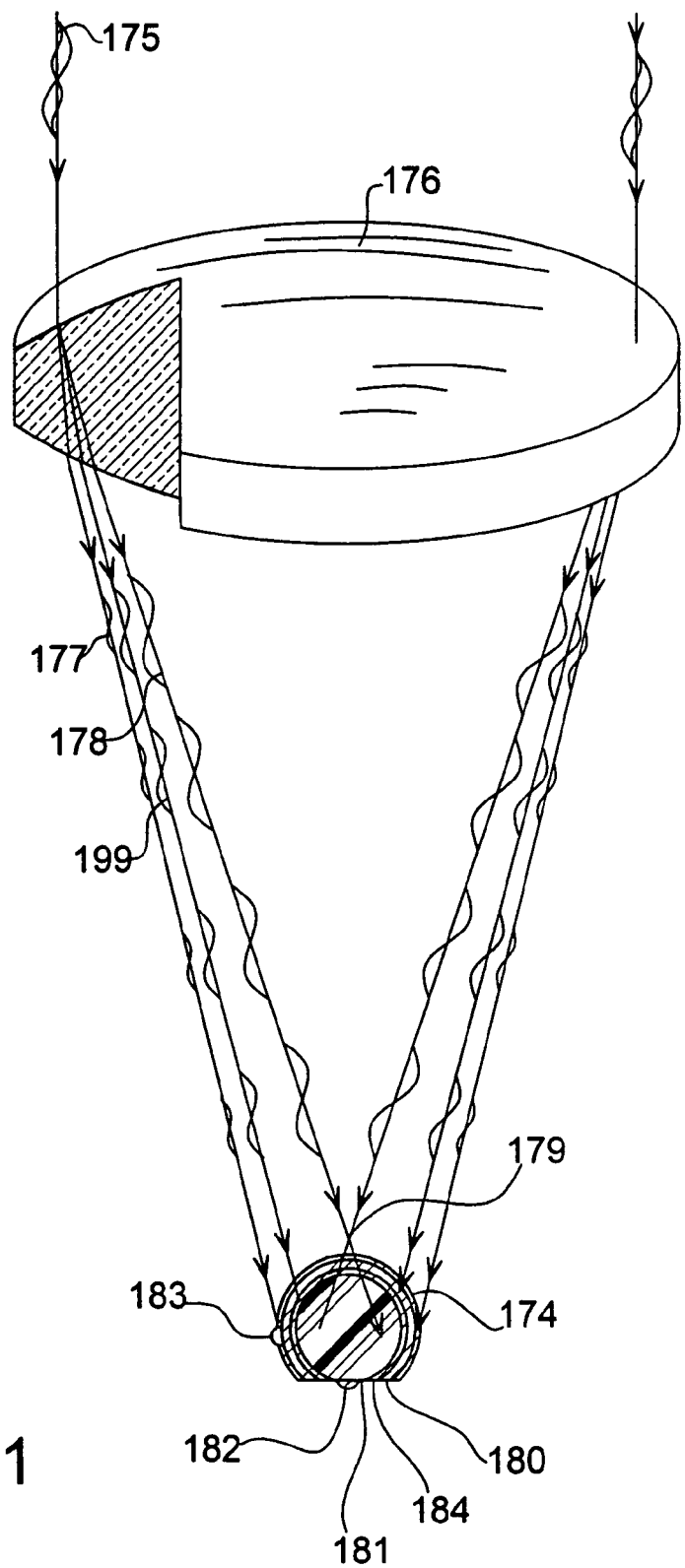

In FIG. 11 a multilayered photodiodes semi-sphere with layers of different band gaps 181, 184, 180 are shown in cross-section. A partial cutout of a spectral spreading and focusing lens 176 is also shown. The blue photon absorbing high energy band gap photodiode layer 180 is the outer layer of the semi-spherical photodiode. A green light absorbing and intermediate band gap energy photodiode layer 184 is the next layer of the semi-sphere. A red light absorbing and lowest band gap layer photodiode 181 is the core semi-sphere. Three layers of semiconductors 181, 184, 180 and separating electrodes are shown as an example of possible layered photo diodes in a semi-spherical geometry. More or less photodiode layers could be used and can be formed by multiple coatings of the central sphere 181. Each photodiode layer 181, 184, 180 will have impurity doping or inter-electrode layers that create a concentration and voltage gradient of a photovoltaic photodiode. On the outside of the photodiodes an anti-reflective coating 174 outer layer of the semi-sphere is added. This anti-reflective coating 174 could be a gradient index fraction material or could be a quarter wavelengths thick transparent material coating that achieves anti-reflection by destructively interfering with the reflection of light. To optimize the light transmission to the photodiodes 181, 184, 180 the anti-reflective coating 174 could be adjusted to maximize the red light 178 transmission at the top of the photodiode semi-sphere and then optimize the transmission for the shorter wavelength 177, 199 of light on the sides of the sphere. Due to the spherical shape and the angle of incidence of the light on the sides of the sphere a uniform thickness quarter wavelength anti-reflective coating 174 will shift the peak transmission to longer wavelengths. Thus, for light concentration systems and when the light direction is controlled onto the photodiode spheres in general the optimum quarter wavelength anti-reflective coating 174 would be thinned on the sides of the sphere to compensate for the angle of incidence change. For this particular example when the light is spectrally distributed onto the photodiode sphere the quarter wavelength antireflective coating 174 can be thinned even more on the sides of the sphere to optimize the light transmission for the green and blue light 177 incident on the sides. A thickness profile varied coating of this type could be accomplished with a vacuum evaporated source and using the effect of angle of incidence on semi-sphere producing thinner coatings.

The layered photodiode semi-sphere 181, 184, 180, 174 is placed behind the focusing optics 176 near the focal point for red light 179. Incident white light 175 is spectrally spread with chromatic aberration where the index of refraction varies with the wavelength of the light. Typically red light 178 through glass has a higher index of refraction than green 199 and blue 177. The semi-sphere photodiodes 181, 184, 180 are placed after the focus point 179 of the red light of the lens 176 such that it optimizes the spatial distribution of colored light spectrum into the layered photo diodes to place the red light focus 179 just outside the photodiodes or inside the central red light absorbing photodiode 181. In turn the green light 199 will form a larger spot and is absorbed more efficiently into the green light absorption band of the photodiode due to the longer path length through the tilted photodiode layer 184. The blue light 177 spot will be the largest diameter and most efficiently absorbed in the outer photodiode layer optimized for blue light absorption and conversion. The longer wavelength red light 178 in general will refract through glass 176 at a higher angle than the green 199 and blue light 177. The red light 178 will pass through the blue 180 and green light photodiodes 184 with low absorption due to being below the excitation band gap of these two photodiodes. This spectral, spatial, and angular distribution of light on to the layered semi-spherical photodiode 181, 184, 180 will tend to optimize the performance of each of the photodiode cells without having to have physically separate the photodiode cells. Some of the green 199 and red 178 light will strike the blue 180 and green 184 optimized photodiodes with these light photons below the band gap energy of the blue and green light optimized photodiodes and partially passes through and onto the green 184 and red 181 layered photodiodes. This layered construction of a layered spherical photodiodes could be less expensive than forming distinct photocells that are then placed together. The electrode contacts in this geometry are shown as attached conductive metal contacts 183, 181. The inner layer contact 182 is attached to the exposed surface of the center of the red photodiode 181, and the outer contact 183 is attached to the surface of the outer blue photodiode layer 180 and through the anti-reflective coating 174. Examples of details of elastic contact geometries to this semi-spherical bead are shown in FIG. 3, FIG. 12B and FIG. 14. Ideally the electrical contacts 182, 183 reflect light and do not block light to the photodiode such as in the elastic contact example of FIG. 14 for this circular spot focus. A mechanical contact would need to make central contact with the central spot contact 182 and use the alignment of the silicon sphere with the form fitting surface to allow only proper electrical contact and placement of the layered photodiode into the radial spectral dispersion pattern of red light in the center and blue light on the perimeter.

It should be mentioned that a roughened or density gradient antireflective coating 174 may be advantageously used in this geometry to avoid spectral and angular selectivity of the typical quarter wavelength anti reflective coating and mentioned earlier.

If a slot version of the semiconductor holding cavity is used the central contact could have a raised button 182 and a dielectric perimeter 185 coating such as the anti-reflective coating extended to cover the edges of the green 184 and blue 180 photodiodes to prevent shorting to the electrical contacts along the groove.

Figure 12A:
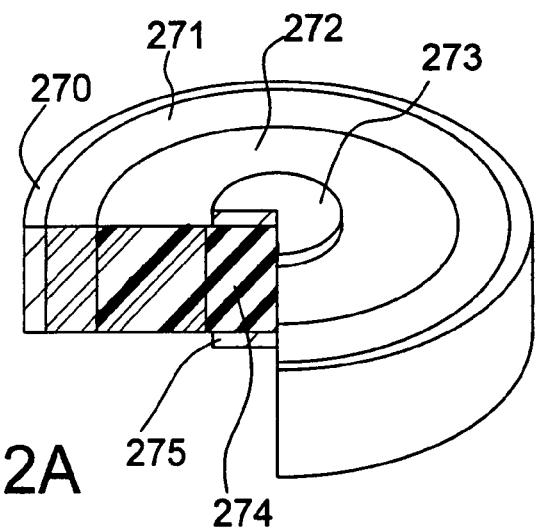
Figure 12B:
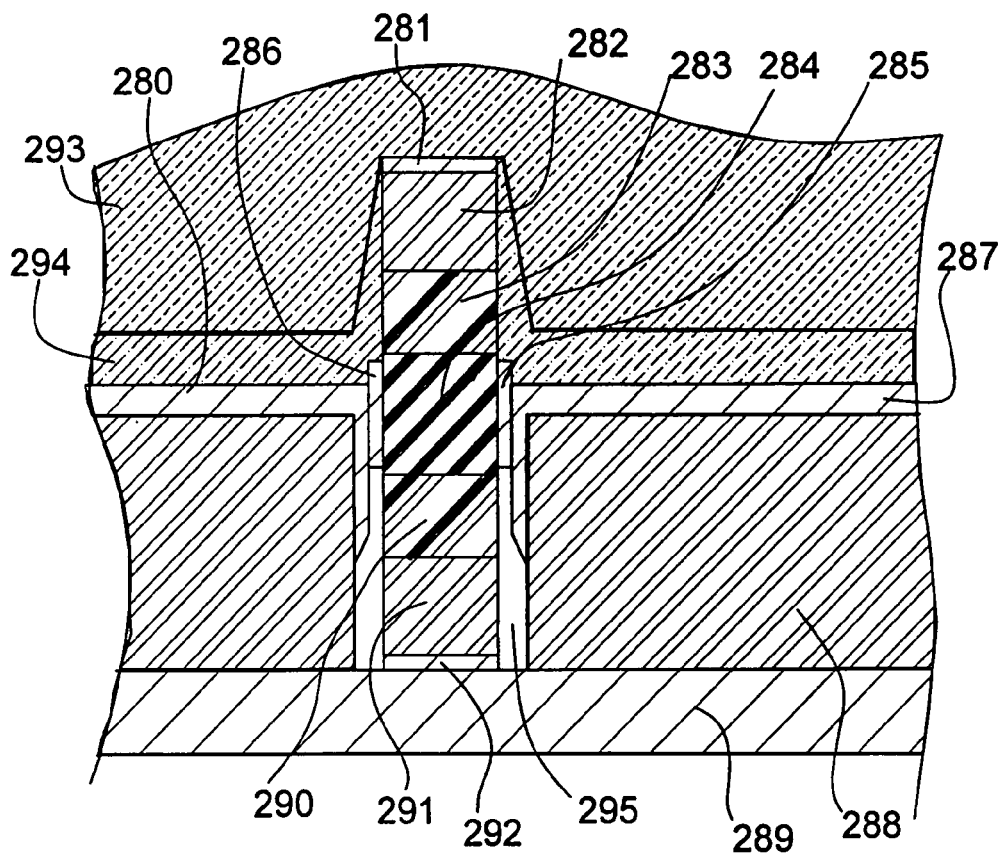

In FIG. 12A an alternative arrangement of forming photodiodes by grinding the particulate bead layered photodiodes on two sides. By grinding the beads on two sides the inner doped layer 274 and other photodiodes 272 can be accessible with two electrical contacts 273, 275. This geometry of a bead with two flat sides versus a single flat side can also be advantageously used to make electrical contacts. As an example of a layered photodiode an InP bead five hundred microns in diameter is formed 274. The InP bead 274 is doped to be an n-type semiconductor. The InP bead is then coated with an n-type InGaAs layer 272 by organometallic vapor phase epitaxy approximately two microns thick. Then a p-type InGaAs layer 271 two microns thick and a sputter deposited gold chromium coating 270. The bead is then ground on two sides and the electrical contact is formed deposited by vacuum deposition or electroplating a nickel/gold contact 272, 275 to the center. There are many variations of materials to produce layered photodiodes or photo emitters. Other suitable substrate bead semiconductors are Ge, Si, SiC, GaAs, GaP, Ga, GaN, CdTe, AlGaP, AlGaP, AlGaAs, CuInSe$_2$, Cu(InGa)Se$_2$, GaSb, IrAs, CuInSe$_2$, Cu(InGa)Se$_2$, CuInS, GaAs, InGaP, AlGaP and CdTe.

In FIG. 12B slot or cavity electrical contact to photodiode bead with rim 281, 292 and center contacts 286, 287 are shown. In this example the photodiode bead as constructed by grinding a layered photodiode bead on two sides, as shown in FIG. 12A, is inserted into the elastic slot 295 in a dielectric 288 with two side contacts 280, 287 and a backing contact 289. The slot or cavity 295 is molded out of an elastic dielectric 288 such as polyimide or silicone rubber on top of a metal foil substrate 289 such as tin. The photodiode bead 281, 282, 283, 284, 290, 291, 292 is pressed into the slot 295. The two side contacts 280, 287 compress against the to center contacts 286, 285 of the photodiode bead. The rim conductor 281, 292 of the photodiode bead makes contact with the foil contact 289 at the bottom of the slot or cavity 295 with elastic compression from the cover lens 293 or mirror pressing the photodiode bead against the back contact. The molded cover glass 293 is held by tension and sealed to the contact electrodes 280, 287 through a Sylgard® transparent interface glue 294 that is cured at elevated temperature under compression pressure between the glass 293 and the electrode substrates 288, 289. At the lower operating temperatures than the glue cure the thermal contraction of the interface glue 294 creates a tension in the glue pulling the cover glass and the electrodes word each other and creating contact compression pressure. Other mechanical elastic, gravity or force schemes can be used to maintain the elastic contact pressure on the photodiode 281, 282, 283, 284, 290, 291, 292.

In FIG. 13A a semiconductor bead alignment and manipulation system is shown. In this system the semiconductor beads 188 that have a flat side 189 are vibrated by sound 186 from a sound generator 185 or vibrations through the support plate 190. The beads 188 will spin until they reach the lowest energy on the flat side of the beads resting on the flat Teflon 187 surface with gravity holding them down. Different intensities of sound vibrations 186 can be used to manipulate the beads to move them far off the surfaces or to have them gently rotate and settle to the lowest energy state flat side of the bead 189 on the Teflon surface 187. The Teflon 187 has an electrostatic charge thus attracting the beads 188 and increases the energy well for the beads to stay on the flat side 189 resting on the flat Teflon surface 187. A high voltage electrode 190 can be placed behind the Teflon 187 surface and high voltage applied from a generator 191 to the electrode 190. A sharp point corona discharge to the semiconductor beads 188 or adjacent electrode 193 or surrounding grounded 192 conductive surfaces can complete the electrical charging circuit and electric field lines to the charge electrode 190. The induced electric field and the charge on the semiconductor beads 188 hold them against the Teflon surface 187.

Shown in FIG. 13B due to the low coefficient of sliding friction of the Teflon surface 204 the beads 201, with their flat sides aligned to the surface, can slide across the Teflon surface 204 without rolling with a pushing bar 200. The pushing bar 200 can push the semiconductors 201 to align the semiconductors in rows with all the flat sides against the Teflon surface 204 on a support plate 205. The pusher bar can have shaped cavities 202, 203 to hold individual semiconductors in discrete positions. If a semiconductor has the wrong position or there are too many semiconductors to from a single row these beads will not fit into the shaped cavity 203 of the pusher bar 200 and can be separated from the beads 201 that have fitted into the slots 202 or holes 203 of the pusher bar and ejected, contact lifted with a silicone rubber surface, or swept off the Teflon surface 204 and the pusher bar 200.

Shown in FIG. 13C a cross-sectional view of the pusher bar 216 being used to press the semiconductor beads 213 into the shaped mirrors or electrical contacts and elastic substrate 210. The electrical charge on the support plate 218 can be released or reversed as the beads 213 are slipped into the shaped cavity 212 electrical contacts 211, 219. The pusher bar 216 can also be heated and/or can have sound pulsed through it to solder or weld the beads 213 contacts 214, 220 to the electrical contacts 211, 219 once they are inserted and clamped by the electrical contact holder 210. The beads can be heated by light or magnetic fields once they are inserted into the holders to achieve soldering or welding of contacts 214, 220. The semiconductor beads could have electrical contacts 214, 220 that are made of magnetic material such as nickel. Thus the magnetic attraction to a magnetized surface 218 or alignment in a magnetic field could be used to align and hold the beads on a holder 218, 217. Other properties that may be utilized to align the beads is to use the self polarized electric field of the beads 213 in an electric field to align the beads 213. It should be mentioned that sticky and electrostatic properties of silicone rubber coated surfaces 215 can act as bead holders allow beads to held without rolling and transferred. The insertion of the semiconductor beads can done with the shaped aperture 212 electrical contacts 211, 219 on the elastic backing 210 being held open for the insertion and then released to mechanically clamp down on the beads 213 and make electrical contact of the round bead contact 214 to the rounded electrical contact 211 and the inner bead contact 220 making contact with the flat surface contact 219 of the elastic holder 210. The mechanical clamping of the holder 210 also allows the beads 213 to be held to allow the pusher 216 to separate from the beads 213 and retract the pusher 216. The pusher 216 could have a silicone sticky surface 215 inside the formed surfaces 222 to allow aligned beads to stick in the cavities and non-aligned beads to be shaken off.

In FIG. 14, the lens mirror electrode compression arrangement is shown in cross-section. Another arrangement of connecting the spherical ground semiconductor photodiode or ground rod 233 is to form a cavity with the mirror contacts 237, 238, 242 that will only permit the cell to be connected in one orientation. The shaped depression, or troughs 239, 241 have a center contact 242 and side contacts 239, 238 as shown in FIG. 14. These contacts 237, 238, 242 and vias 243 can be formed by ink jet spraying electrically conductive powder inks such as silver, copper, nickel, graphite, aluminum, tin, and alloys onto the dielectric substrate such as molded or shaped polyamide 239, 241. Other methods of forming the electrical contacts and circuit films 237, 242, 238, 243 are sputter deposit, plasma sprays, electroplating, foil embossing, electrically conductive films onto the pre-formed flat sheet or formed dielectric substrate 239, 241. Other options are to coat or laminate a sheet metal substrate to hold the form of the contacts and act as another back protective surface 244. The side contacts 237, 238 have a dielectric coating 235, 236 deposited part way up from the flat bottom of the electrical contact 237,238 and dielectric backing substrate 239, 241 to not allow the semi-spherical bead 233 to make electrical contact with the side contact electrodes 237, 238 if the rounded surface of the bead 233 is touching the center electrical contact. The dielectric coating 235, 236, such as Teflon or silicone fluoro polymer, can have a low coefficient of friction to permit the semispherical bead 233 to easily slip and spin until the flat side of the semiconductor photodiode bead 233 orients parallel flat surface bottom of the trough or depression 239, 241. With gravity holding the loose bead down toward the bottom of the trough or depression 239, 241 and with the bead fitting the deepest into the trough or depression with the flat side of the bead 233 parallel to the bottom they will reach the lowest energy state. If vibration energy or sound energy is imposed upon the semi-spherical beads, the beads can rotate and spin until the flat section of the beads fits against the flat bottom of the trough or depression 239, 241. This gravitational effect can be enhanced if electric fields are imposed between the electrodes 239, 242, 238 and an exterior electrode not shown. The dielectric films 239, 241, 234, 236 often are permanent electrets or can be poled and charged with imposed electric fields. By forming the center contact 240 on the semi-spherical bead 233 with a ferromagnetic material such as nickel and making the center contact 242 out of a ferromagnetic material such as iron or nickel and then having the contacts 242, 240 be magnetized or placed in a magnetic field the bead will preferentially be oriented in the magnetic field and the magnetic fields will be channeled and concentrated through the center contacts 240, 242. This would increase the energy well of the aligned beads with the flat surface of the bead 233 parallel to the trough or depression 239,241 of the mirror contacts 238,237. The side electrode surfaces 237, 238, make contact with the sides of the semi-spherical bead 233 when the beads are correctly aligned. The photodiodes semiconductor bead 233 will typically be doped to have a positive charge carrier doping on the interior and a negative charge carrier doping on the outside. Thus electrical contact on the flat surface of the bead 240 is making contact 242 with the P interior layer and the outer surface contacts 237, 238 are making contact with the N layer. Due to the differences in coefficient of friction between the side contacts 237, 238 of the bead 233 with the dielectric coating 235, 236 and the side contacts 237, 238 the beads 233 will tend to stick into the depression 239, 241 once they make metal contact. The shape and elasticity of the trough or depression 239, 241 can be made such that it forms a wedging contact 237, 238 on either side of the bead to hold the bead once it makes correct alignment. It may also be useful to have the alignment process occur at an elevated temperature near where the bead side contacts 237, 238 will solder or sick to the bead 233 outer surface, thus also making the side contacts sticky to the beads and holding the beads once they have made parallel surface alignment and electrical contact. Other possible holding schemes are to have small droplets of glue, silicone rubber, or viscous liquid on the dielectric separator 239, 241 in the bottom of the trough or depression that when the bead flat surface is aligned reduces surface tension energy by making contact with the flat surface of the bead 233. This will act as a bead holder and increase the energy well to hold the beads in the flat surface of the beads parallel to the flat surface of the trough or depression. To remove excess or non-aligned beads 233 the assembly could be flipped over and let gravity pull out beads 233 not held in place. Other options are to place a formed tool with a sticky surface coating, such as silicone rubber, such that when it is lowered over the surface of the array it will make mechanical contact with only the excess beads. The beads 233 in the incorrect positions will rest higher in the troughs or depressions than the parallel surface aligned beads 233. A process of checking that all beads 233 are aligned could be done by visual inspection or having a precision tool with a vacuum or sticky surface that fits into the trough or depression and only makes contact and remove cells that are not fitting correctly into the troughs or depressions 239, 241. Once the flat surface of the bead 233 is aligned to the flat surface of the trough or depression 239, 241, 237, 238 the electrical contacts 239, 240, 242, 238 can be assured by heating the semiconductor bead 233 with a flash of light, or thermo mechanical contact to the beads 233 with heated metal body touching and compressing the beads 233 against the electrical contacts 237, 242, 241. Other possible methods of delivering energy to make solder, brazing, or welding contacts are to pulse ultrasonic sound energy into the semiconductor beads 233 and contacts 237, 242, 238 to friction weld or solder the contacts. An electrical pulse through the circuit and cells 237, 238, 233, 240, 242 can also be used to create arc welding of the electrical contacts to the semiconductor photodiode beads 233. Another electrical contact welding, brazing, annealing, or solder method is to use self generated electrical pulse from the semiconductor photodiode 233 if the electrical circuit 237, 238, 233, 240, 242, is short circuited, attached to an electrical source, or charged capacitor and then a beam of laser light is rastered across the cells or a flash lamp is fired next to the cells. Creating a short electrical pulse to provide a short thermal energy pulse at the mechanical contact points to the welding, brazing, annealing or soldering the contacts. The center contact 242 or side contact metal films on top of the dielectric substrate 241 can be designed such that they act as an electric fuse melting and vaporizing the metal 242, 237, 238, 243 and expanding the underling dielectric 239, 241 to open the circuit if the local circuit if excessive current flows through the circuit. This could be used to disconnect cells that may have been miss-connected or are shorted. The contact assurance step can also be done after the assembly under the refractory lens and mirror 231 is placed over the cells and they are held in place by the refractory lens and mirror 231. The refractory cover lens and mirror 231 can press against the semiconductor bead 233 to make electrical contacts and maintain electrical contact throughout the lifetime of the solar array. The refractory cover 231 can be pressed and held with glues 232 and elastic tension in the electrical contact material 237, 239, 238, 241, 242 and gravity of the refractory material resting on the semiconductor 233 against the contact material 237, 242, 238 can maintain contact over the life of the array. The lens-mirror assembly sheet 231 can have a protective or antireflective coating 230 on the outer surface. Suitable films are fluorocarbons (Mihama) titanium dioxide coatings to make the outer surface photo reactive and self cleaning or hard anti-scratch coatings such as reactive sputtered diamond films. Optically transparent glue or coupling gel 234, 232 (such as Dow Corning Sylgard® 184 or gel Q3-6575) is dispersed such as with a high pressure extrusion over the cells. The glass or transparent dielectric cover lens-mirror 231 is places over optical coupling material 234, 232 and with a roll squeezing motion optical coupling material 234, 232 is pressed around the semiconductor and mirrors the gas bubbles are pressed out of the assembly through gas channels in the pattern of the glue. The entire assembly can be cured with elevated temperatures. The assembly can be cured under compression to press the lens-mirror sheet 231 against the semiconductor beads 233 and maintain compression on the electrical contacts 237, 240, 242, 238. Shrinkage of the glue or optical coupling material 234, 232 after or during the curing process could further increase the compression of the lens-mirror sheet 231 onto the beads 233 and contacts 237, 240, 242, 238 during and after the curing process. On the backside of the dielectric substrate 239, and the metal contacts 242 a radiant heat transfer and protective coating 244 such as carbon black loaded silicone paint or titanium dioxide silicone paint. The assembled system can be tested and with light pulses, rastered laser beams, or electrical pulses shorted cells or reversed cells can be removed from the array parallel series electrical circuit by melting or vaporizing electrical contacts. Electrical connections to the outside electrical systems and circuits are expected to be made through electrical contact pads at the edges of the glass material sheet 231.

FIG. 15 an electrical circuit of series parallel cells with thin film electrical conductors or dielectrics, fuse, or varistors 253, 258 in the parallel and series connections between photovoltaic cells 253 and back flow protection diodes 254 or varistors 254 built in on the output is shown. The reverse flow protection component 254 can also be placed by the same method of doped semiconductor beads placed in elastic shaped electrical contacts with the reverse electron hole gradient to the photodiodes as indicated in the schematic drawing FIG. 15. The reverse current protection diodes 254 are not illuminated and therefore can be placed outside of the light concentration regions either between the mirror arrays on the edges of the arrays. The reverse current protection diodes 254 can be placed periodically as rows in the array to be able to match the protection diodes voltage and current characteristics and create distributed reverse current protection avoiding any single protection diode or string of protection diode failures jeopardizing the entire system. The fractional loss effect of a single cell becoming an open circuit in parallel connected cells is one divided by the number of cells connected together. The effect of a single point failure on the entire system from a single point failure in a series parallel electrically connected network is proportional to the fraction of loss in a row divided by the number of rows since the current from the other rows will be able to flow around the single point failure. The number of random single cell failures is proportional to the total number of cells in the circuit. Therefore in large arrays of many parallel connected cells at equipotentials and series connections where the number of cells in any single row is proportional to the square root of the total number of cells in the array the probable fractional loss from random single open circuit failures is proportional to the inverse square root of the total number of cells in the array. This statistical observation has the practical implication that with series parallel arrays; the higher the number of individual cells in an array the lower the lower the fractional losses due to random cell failures. These photovoltaic arrays become more reliable the higher the number of cells, which is contrary to typical intuition that the more cells in an electric circuit the more probability of failures and output loss. In high voltage arrays the reverse current protection cells 254 and bypass diodes 257 can be periodically formed in rows in the arrays. The parallel electrical connections 253 between cells are useful in having a current bypass around single cells in the array that may have low performances due to manufacturing defects or shading. The bypass diodes 257 can route current around a row of cells 252 that have a low performance or be shadowed. The parallel 253 and series 258 electrical connections can form effective fuses by thin conductive deposits on dielectric insulator substrates or varistors by depositing with the electrical conductors semiconductors that have been chosen to have a specific electrical resistively increase as the current, voltage or temperature rises. A particular example a film of zinc oxide will increase its resistance with applied voltage. The deposits can be vacuum sputter deposits, spray ink deposits, plasma spray deposits, foil embossed, individual semiconductor deposits similar to the photodiode bead connections. Most metals have the desirable characteristics of a low resistance at ambient temperatures and then increasing resistance as the temperature rises. If excessive current flows through the parallel or series electrical connections such as several times that of single diode, the metals heat due to ohmic energy dissipation in the material. If the current and heat generated is high enough, the circuit would melt the metal and possibly the dielectric substrate and permanently open the parallel circuit connection. Open circuit fusing between the cells 253 can be used to permanently open the circuit around individual photo cells 252 if they are shunted or connected in reverse. Devices such as varistors 253 can be formed in the parallel circuit connections that are designed to have and increasing resistance as current rises. The varistors 253 could be designed to reversibly respond rapidly to excessive current and effectively clamp the maximum current in the parallel or series connections. This maximum current clamping can be very important to protect the photodiodes from excessive currents and voltages in situations where an illuminated photovoltaic array is selectively shadowed such as a shadow from a tree limb. This array schematically shown can be connected 250, 256 through the perimeter bus connections 251, 255 to other arrays or the electrical loads. Other possible electrical devices that could also be electrically connected on the output connection or bus connection 250, 256 and integrated with the array as shown in FIG. 9 are DC to DC converters, DC-AC converters, capacitors, batteries, electrolysis cells, flywheels, motors, lights, pumps, and fans.

Some Features and Elements of the Invention Include:
1. The electrical contacts maintain compression on the semiconductor bodies with elastic mechanical systems.
2. Use the shape of the photodiode body or electrodes to orient the semiconductor.
3. Use a slot or hole to fit the cell.
4. Use the flat side of the sphere to hold, orient and move to the electrical connection.
5. The slot is also an electrical connection.
6. The slot is also a mirror.
7. The slot is also light transmitting.
8. The position and dimensions of the electrical contacts on the spheres can be advantageous for semiconductor operation.
9. The electrical contacts have thickness to provide for electrical properties of fuse and circuit interruption.
10. The electrical contacts can be mirrors.
11. The electrical contacts can be transparent.
12. The electrical contacts can be dissimilar electrical conductors or metals.
13. The electrical contacts and semiconductor can essentially form a thermoelectric junction.
14. The electrical contacts and semiconductor can form a light producing junction.
15. The slot and electrical contacts form a heat removal system.
16. The electrical contacts and or mirrors are heat conductors to remove heat from the photodiodes.
17. A coating on the back side of array enhances the radiant emission and heat removal.
18. The mirror/lens is a heat removal system.
19. The mirror/lens is a mechanical mount and protection system.
20. Use parallel series connections to provide reliable circuit connections.
21. Can use glues.
22. Can use optical interface bridges or glues.
23. Can use light curing glues.
24. Can use sticky materials to secure cells in slots.
25. Can compress spheres in slots to make contacts.
26. Can use soldering to complete contacts.
27. Can use welding to achieve electrical contact securing.
28. Can use a flash lamp to achieve electrical contact securing with the photo diodes generating the electrical current to weld and or thermal heating of the cells.

29. Can use ultrasonic energy to complete soldering or welding.
30. Can coat the optic with thin films as reflectors or electrical circuits.
31. Beads in grooves or holes with two or more different contacts on either side.
32. Does not necessarily use the shape (simply orient before going into slot).
33. The arrays are an assembly of components of lens/mirror discrete semiconductor tow electrical contacts and back cover or mirror.
34. The slots or holes can be made in a dielectric.
35. The slots or holes can be made in metal with dielectric coating.
36. The slots or holes can be made in metal with dielectric and electron conducting coatings.
37. The walls of the shaped cavities can have structure to improve the electrical contact elasticity.
38. The walls of the shaped cavities have flutes, slits, grooves, bumps, pedestals, fibers for electrical contact elasticity.
39. The electrical coatings on the cavities contact surfaces have fibers, powders for electrical contact elasticity.
40. The contacts on the shaped cavities are elastic polymorphic surfaces.
41. The coatings can be deposited or formed in many ways. Vacuum deposited, ink jet printing, powder sprayed, screen printed, foil impression, soldered, stamped or laminated.
42. Use silicone rubbers.
43. Use fluorinated hydrocarbons.
44. Use glass, aluminum, silver, tin, tin oxide, steel, copper, alloys, silicon spheres, Sphelar® silicon, spheres with electrical contacts on them, solder pastes, carbon loaded paints, TiO2, photo-catalyst or white coatings.
45. Use photo-catalyst impregnation of outer surfaces of glass or index of refraction material to clean the outer surfaces, and block high frequency light from reaching the photodiodes.
46. Use shadow of slot to preferentially locate deposits or self masking of electrical circuit
47. The electrical connections and substrate can form a light collecting system to the photo diode
48. The photodiode array can be coupled to a light concentrating optic
49. The electrical connection system can also be an optical component
50. A back protector sheet can also be on optical light collector
51. Light scattering can also be used in the optic
52. Light scintillation or conversion could be used
53. Rods of semiconductor in electrical contact and clamping slots to also work as an effective photovoltaic cell
54. Built in electrical reverse current protection
55. Conversion to batteries inverters and electrical power grid
56. Use with sun tracking systems
57. Use spectral splitting or filtration
58. Could place a chimney or fluid flow channel on back of arrays and use flow of fluid or air to cool the photodiode array.
59. Could thermally couple phase change materials to the back to the photodiode array to absorb and store heat from the photovoltaic array.
60. Could attach electronics to manipulate the electrical output of the photovoltaic array.
61. Could attach batteries to the photovoltaic array to store electrical energy.
62. Use elastic layer under electrical contact to insure electrical contact and be a thermal expansion and contraction compensator.
63. Attach the photovoltaic array to a sun alignment or tracking system.
64. The clamp is elastic and can be opened to accept the semiconductors and closed to make contact.
65. Use electrostatics to move and hold semiconductors.
66. Use magnetics to move and hold semiconductors.
67. Use gravity to move and hold semiconductors.
68. Use sticky surfaces to hold semiconductors.
69. Use sticky surfaces to hold semiconductors at the bottom of the recesses.
70. Use slippery surfaces to allow non-rolling contact movement of semiconductors.
71. Gravity can be used to press the glass cover and lens mirror into the cell and electrodes to maintain compression between the semiconductor and contacts.

While the invention has been described with reference to specific embodiments, modifications, and variations of the invention may be constructed without departing from the scope of the invention, which is defined in the following claims:

I claim:

1. An apparatus comprising a direct or indirect photon converter or producer and electrical connection apparatus comprising repetitively shaped granular semiconductor bodies, each of the bodies having a flat surface, and a dielectric layer having one or more, hemispherical or cylindrical slot, hole, slots, or holes with a complementary flat surface or surfaces made from a dielectric material or dielectric material coating an electrical conductive material to hold a semiconductor body or bodies, a light conduit to the semiconductor bodies, and at least two electrodes that are part of the slot or hole that with elastic compression of dielectric material at a contact point on opposite sides of slot or hole touch on opposite sides of each semiconductor body.

2. The apparatus of claim 1, wherein the light conduit further comprises mirrors, lenses, transparent materials, scintillators, phosphors, scattering surfaces, diffractive, or interference structures.

3. The apparatus of claim 1, wherein the light conduit comprises mirrors, refractors, lenses, scintillators, phosphors, scattering surfaces, or interference structures which concentrate light to the photon converters.

4. The apparatus of claim 1, further comprising a non-flat light transparent refractive cover shaped to fit over the shaped semiconductor bodies and concentrate light to the semiconductor bodies, and wherein the bodies that are electrically connected form an array of photovoltaic cells.

5. The apparatus of claim 1, wherein the hole, slot, holes or slots are shaped to fit the shapes of the semiconductor bodies.

6. The apparatus of claim 1, wherein each semiconductor body has a shape, and each slot or hole has a shape, which will not allow assembly in any orientation that makes improper electrical connections.

7. The apparatus of claim 1, wherein each semiconductor body has a shape and structure, and each slot or hole has a shape and structure, that results in an elastic compression on the semiconductor body.

8. The apparatus of claim 1, wherein each semiconductor body has a shape and structure, and each slot or hole has a shape and structure, that results in an elastic compression of the at least two electrodes on two different regions of each of the semiconductor bodies to form a photodiode or thermocouple.

9. The apparatus of claim 1, wherein each semiconductor body has a specific repeated shape structure that fits each slot or hole shape and structure, and further comprising a light transmitting cover placed over the semiconductor bodies that results in an elastic compression or elastic containment of the at least two electrodes on two different regions of each semiconductor body to form a photodiode when the semiconductor body is placed between the slot or hole and the light transmitting cover.

10. The apparatus of claim 1, wherein each semiconductor body has a shape and structure, with a light transmitting dielectric cover, and wherein each slot or hole has a shape and structure that results in an elastic compression or elastic containment of the at least two electrodes on two different regions of each semiconductor body to form a photodiode.

11. The apparatus of claim 1, wherein each semiconductor body has a shape and structure, with a light transmitting dielectric cover, and wherein each slot or hole has a shape and structure, that results in an elastic compression or elastic containment of the at least two electrodes on two different regions of the semiconductor to form a photodiode with light concentration from light refracted, diffracted, scattered, interfered, fluoresced, or reflected through the light transmitting dielectric cover, or and reflected, refracted, scattered, diffracted, interfered, or fluoresced from the electrodes.

12. The apparatus of claim 1, wherein each shaped semiconductor body is electrically connected by using each slot or hole that has the two or more electrodes as part of the hole or slot, and each slot or hole has a shape and structure that results in an elastic compression or elastic containment of two electrodes on two different regions of each semiconductor body to make electrical contact and form a photodiode, further comprising a shaped light transmitting dielectric cover, with light concentration from light refracted, diffracted, scattered, interfered, fluoresced, or reflected through the light transmitting dielectric cover, or and reflected, refracted, scattered, diffracted, interfered, or fluoresced from the electrodes.

13. The apparatus of claim 1, wherein each shaped semiconductor body is electrically connected by using each slot or hole that has the two or more electrodes as part of the hole or slot, each slot or hole having a shape and structure that results in an elastic compression or elastic containment of the at least two electrodes on two different regions of the semiconductor body to make electrical contact and form a photodiode, further comprising a shaped light transmitting dielectric cover, with light concentration from light refracted, diffracted, scattered, interfered, fluoresced, or reflected through the light transmitting dielectric cover, or and reflected, refracted, scattered, diffracted, interfered, or fluoresced from the electrodes, and an elastic dielectric material between the electrodes and an outer elastic cover and a light transmitting dielectric material between the light transmitting dielectric cover and the semiconductor body and or the outer elastic cover.

14. The apparatus of claim 1, wherein each hole or slot is an elastic structure that can be elastically pried open to accept the semiconductor and then the prying force released or the semiconductor body push wedged into the hole or slot and the semiconductor body remains under compression force from the elastic structure.

15. The of claim 1, wherein each semiconductor body has a shape and structure, further comprising a light transmitting cover, and wherein each slot or hole has a shape and structure, that results in an elastic compression of two electrodes on two different regions of the semiconductor to form a photodiode and that the electrodes are welded, diffused, soldered, brazed together and the light transmitting cover and the slot or hole structures are affixed to each other.

16. The apparatus of claim 1, wherein light converted by the photon converter is sunlight, thermal radiation, radioactive light emission, chemical light emission, from an electric light source, or laser light.

17. The apparatus of claim 8, wherein light conduit and the slot or hole structure are affixed to each other with glues, soldering, welding, clamps, fasteners, or interlocking components.

18. The apparatus of claim 1, wherein the electrodes are affixed to the slot, slots, hole or holes by vacuum deposition, powder deposition, ink jet printing, lamination, foil embossing, plasma spraying, electroplating, gluing, or incorporation.

19. The apparatus of claim 1, wherein each shaped semiconductor body has a flat area that is used to orient the semiconductor body in the slot or hole.

20. The apparatus of claim 1, wherein at least one semiconductor body has been doped to create a region of electron surplus and a region of a hole surplus to create a population gradient, and wherein the at least two electrodes comprise an electrical conductor contacting the electron surplus region and an electrical conductor contacting the hole surplus region and an exterior voltage gradient to create a photodiode.

21. The apparatus of claim 1, wherein at least one semiconductor body used two different material electron conducting contacts to the semiconductor body and forms a thermoelectric junction, thermoelectric junctions, electron tunneling junction, electron tunneling junctions, themionic junction, or themionic junctions.

22. The apparatus of claim 1, used as a photovoltaic cell, light emitter, thermal energy to electric converter or refrigerator.

23. The apparatus system of claim 1, further comprising an electrical connection which is also a light collection system of either a light reflector, refractive reflector, scatterer, scintillator, or phosphor.

24. The apparatus of claim 1, wherein the light conduit is a light concentrating optic coupled to the formed photodiodes.

25. The apparatus of claim 1, wherein the formed slot or hole or slots or holes are part of the light conduit.

26. The apparatus of claim 1, wherein the formed slot or hole or slots or holes have electrical carriers that also serve as light collecting components.

27. The apparatus of claim 1, further comprising electric connections which also serve as fuses by having low amounts of electrical conductor being on or surrounded by dielectric material.

28. The apparatus of claim 1, wherein the electrodes are made of electrically conductive foils, thin films, fibers, matrixes, pedestals, hairs, fabrics, meshes, powders, elastic polymophic surfaces or films on surfaces.

29. The apparatus of claim 1, wherein the electrodes are deposited on a dielectric substrate with techniques of sputtering, vacuum evaporation, plasma spray, powder spray, ink jet printing, screen printing, electroplating, or foil lamination.

30. The apparatus of claim 1, wherein the electrodes are supported with an elastic dielectric material on top of another elastic electron conductive material.

31. The apparatus of claim 1, wherein the elastic compression of the electrodes elastically bridge or buffer differential thermal expansion dimensional component differences.

32. The apparatus of claim 1, wherein the electrodes have electrical contacts, and wherein structure of the light conduit and optical components and the electrical contacts and interface materials are formed in folds, dimples, polymorphic surfaces, curves, and bends to redirect or dissipate thermal expansion stress between materials.

33. The apparatus of claim 32, wherein the optical components and the electrical contacts and the interface materials are formed in folds, dimples, polymorphic surfaces, curves, and bends to modify radiant heat transfer and heat transfer to fluids adjacent to the elastic containment.

34. The apparatus of claim 33, further comprising a radiant emission or convection enhancing heat transfer structure or material coating on one outer surface of the contacts.

35. The apparatus of claim 1, wherein the shaped semiconductors are oriented and moved and held on a low friction surface before being placed in the holes or slots.

36. The apparatus of claim 1, wherein the slots or holes have a dielectric film coated on part of the electrodes.

37. The apparatus of claim 1, wherein the slots or holes have a low coefficient of friction dielectric as a fluorocarbon or silicone lubricant deposited into part of the hole.

38. The apparatus of claim 1, further comprising gravity, electrostatic charge, electric field, or magnetic fields can be used on the semiconductors to orient or hold the semiconductors.

39. The apparatus of claim 1, further comprising a sticky surface located within the formed slot or hole and used to hold the shaped semiconductors within the shaped slots or holes or as a temporary holding surface.

40. The apparatus of claim 1, wherein the shaped semiconductor body is a photodiode and is a sphere which is ground, cut, molded, or flattened on one or multiple sides and at least one of the electrodes is attached to the flat side.

41. The apparatus of claim 1, wherein the shaped semiconductor body forms a photodiode from a sphere or granular body of semiconductor which is ground, cut, molded, or flattened on one or multiple sides and at least one of the electrodes is attached to the ground side and another of the electrodes is attached to another area of the shaped semiconductor body as to have the electrodes not contacting each other.

42. The apparatus of claim 1, wherein the shaped semiconductor is formed with layers of dopants or materials to form multiple photodiodes.

43. The apparatus of claim 1, wherein the light conduit splits the spectrum and places the split spectrum optimally into different regions of the shaped semiconductor body.

44. The apparatus of claim 1, wherein the electrodes remove heat from the semiconductor.

45. The apparatus claim 1, further comprising a coating on a surface of the converter shadowed from the light source, wherein the coating enhances radiant heat emission or convection from this surface, the coating further comprising bumps, fibers, fins dimples, or ridges, or titanium dioxide particles, graphite particles, or carbon black particles loaded polymer or rubber film.

46. The apparatus of claim 1, wherein the light conduit is thermally coupled to the semiconductor.

47. The apparatus of claim 1, wherein the light conduit also forms a cover that partially or fully surrounds the semiconductor.

48. The apparatus of claim 1, wherein the electrical connections to the semiconductor form an array of parallel and series connections circuit.

49. The apparatus of claim 1, wherein the electrical connections to the semiconductor are electrical conductor adjacent to a larger amount of insulator to act to open the electrical circuit if the electrical conductor is excessively hot, melts or vaporizes.

50. The apparatus of claim 1, wherein the electrical connections to the semiconductor form an array of parallel and series connections circuit where the parallel electrical connections between semiconductors are electrical conductors that have an increasing resistibility with current flow.

51. The apparatus in claim 1, wherein the semiconductor or electrodes are held with glue.

52. The apparatus of claim 1, wherein the light conduits are held to the photodiodes with glues.

53. The apparatus in claim 1, wherein the semiconductor or electrodes are held with glue that also reduces optical reflections between the light conduit and the semiconductor.

54. The apparatus of claim 1, wherein the light conduit at the interface between an exterior and the semiconductor, which has surface treatments that reduce light reflections by destructive interference coatings or index of refraction gradients.

55. The apparatus of claim 1, wherein the semiconductor or electrodes are can be held with glue that has a curing initiated by are light, heat, change of temperature, humidity, chemical contact, chemical diffusion, vibrations, or radiation.

56. The apparatus of claim 1, wherein the semiconductor is can be held with sticky materials to secure the semiconductor in the slots or holes.

57. The apparatus of claim 1, wherein the semiconductor and electrodes secure electrical contacts by soldering, welding, diffusion, brazing, or alloying with heating from heat conduction, hot gas contact, flash light absorption, laser light absorption, vibrational energy or electrical current.

58. The apparatus of claim 1, wherein the electrodes are thin film electrical circuits.

59. The apparatus of claim 1, wherein the electrodes are thin film electrical circuits deposited on the refractory optics.

60. The apparatus of claim 1, wherein the electrodes are thin film electrical circuits deposited on refractory optics that also reflect light to the semiconductor.

61. The apparatus of claim 1, wherein a second shaped slot, hole, or holes are used to hold and position the semiconductors to place the semiconductors into the formed slot, hole, slots or holes.

62. The apparatus of claim 1, wherein a plethora of semiconductor bodies and holes and slots are formed into an array with an electrical circuit network.

63. The apparatus of claim 1, wherein a plethora of semiconductor bodies and holes and slots are formed into an array with light concentrating optics to each semiconductor and with a circuit network in electrical contact with the semiconductors.

64. The apparatus of claim 1, wherein a plethora of semiconductor bodies and holes and slots form light conversion circuits with multiple semiconductors electrically parallelly connected and the electrically parallelly connected semiconductors connected in series to other electrically parallelly connected semiconductors to form an electrical matrix.

65. The apparatus of claim 1, wherein a plethora of semiconductor bodies and holes and slots can form light conversion circuits with multiple semiconductors electrically parallelly connected and these electrically parallelly connected semiconductors connected in series to other electrically parallelly connected semiconductors to form an electrical matrix that has semiconductor bodies placed in a slot, holes, or slots electrically connected in parallel that act as high voltage condition bypass diodes around photon converting parallel connected semiconductors.

66. The apparatus of claim 1, wherein a plethora of semiconductor bodies and holes and slots forms light conversion circuits with multiple semiconductors electrically parallelly connected and these electrically parallelly connected semiconductors series are connected to other electrically parallel connected semiconductors to form an electrical matrix with semiconductor bodies placed in a slot, holes, or slots that act as reverse current flow condition blocking diodes.

67. The apparatus in claim 1, wherein the slots, holes or electrodes have textures, bumps, particles, ridges, flutes, fins, hairs, or elastic polymorphic surfaces.

68. The apparatus of claim 1, wherein the semiconductor bodies are made of semiconductors such as arsenic doped silicon, phosphorus doped silicon, SiC, InAs, $CuInSe_2$, $Cu(InGa)Se_2$, CuInS, GaAs, InGaP, CdTe, AlGaAs, AlGaP, Ge or layers thereof.

69. The apparatus of claim 1, wherein the slots or holes are made in a dielectric such as such glass, polyimide plastic, polyaramide plastic, polyester, fluorinated hydrocarbons, ceramics, silicone rubber coated steel, or aluminum, silicone fluorocarbon coated steel or aluminum, glass coated steel, copper, brass, or aluminum, ceramic coated steel or plastic coated steel or aluminum.

70. The apparatus of claim 1, wherein the electrodes are made from electrical conductors such as gold, platinum, palladium, silver, tin, aluminum, antimony, lead, copper, zinc, titanium, molybdenum, tantalum, tungsten, aluminum, nickel, carbon, silicon, iron, chromium, vanadium, niobium, zirconium, indium, alloys containing one of these materials or conductive compounds such as tin oxide, zinc oxide or boron doped diamond.

71. The apparatus of claim 1, further comprising a dielectric cover is made from glass, light transmitting plastics, fluorocarbon plastics, and silicone fluorocarbons.

72. The apparatus of claim 2, wherein the scatterer is made of particles of titanium dioxide.

73. The apparatus of claim 2, wherein the scintillator is made of anthacene doped plastic or rubber.

74. The apparatus of claim 2, wherein the phosphor is made of zinc sulfate doped with copper or silver or yttrium aluminum garnet.

75. The apparatus of claim 1, wherein the semiconductor is made of doped silicon spheres, with at least one flat side.

76. The apparatus of claim 1, wherein the semiconductor is made with a doped silicon sphere with one carrier doping on the inside of the sphere and the other carrier doping on the surface layer of the sphere with at least one cut or ground side flat sufficient to expose the interior doped region, an electrical conductor material spot attached to the interior doped region exposed flat region.

77. The apparatus of claim 1, wherein the semiconductor bodies are electrically connected in parallel to an array of other like semiconductors and series connected to like semiconductor and connected to electrical components such as wires, diodes, switches, fuses, capacitors, batteries, fuel cells, flywheels, DC-DC converters, DC to AC converters.

78. The apparatus of claim 3, wherein the light concentrating optics are pointed and tracked to a disk of the sun to concentrate light into the photodiodes.

79. The apparatus of claim 4, wherein the array has an enclosure over the surface of the array facing away from the source of light that passes fluids past the surface to remove heat such at by convection, pumped fluid flow and vaporization.

80. The apparatus of claim 4, wherein the array has an enclosure over the surface of the array facing away from the source of light that holds a material that undergoes a thermal phase change to absorb heat from the photodiodes.

* * * * *

UNITED STATES PATENT AND TRADEMARK OFFICE
CERTIFICATE OF CORRECTION

| | | |
|---|---|---|
| PATENT NO. | : 8,013,238 B2 | Page 1 of 1 |
| APPLICATION NO. | : 11/825681 | |
| DATED | : September 6, 2011 | |
| INVENTOR(S) | : Robert G. Hockaday | |

It is certified that error appears in the above-identified patent and that said Letters Patent is hereby corrected as shown below:

In the claims:

Column 25, line 60, after "The" insert --apparatus--.

Column 26, line 28, change "themionic" to "thermionic".

Column 26, line 29, change "themionic" to "thermionic".

Column 26, line 51, change "polymophic" to --polymorphic--.

Column 27, line 49, after "fins" insert --,--.

Column 28, line 3, change "in" to --of--.

Column 28, line 7, change "in" to --of--.

Column 28, line 16, delete "can be".

Column 29, line 12, delete "such".

Column 29, line 27, delete "is".

Column 30, line 25, change "at" to --as--.

Signed and Sealed this
Seventeenth Day of February, 2015

Michelle K. Lee
*Deputy Director of the United States Patent and Trademark Office*